United States Patent [19]

Douglass

[11] Patent Number: 5,691,935
[45] Date of Patent: Nov. 25, 1997

[54] MEMORY ELEMENT AND METHOD OF OPERATION THEREOF

[76] Inventor: Barry G. Douglass, 1930 W. Rundberg La. Apt. 1236, Austin, Tex. 78758

[21] Appl. No.: 675,388

[22] Filed: Jul. 2, 1996

Related U.S. Application Data

[63] Continuation-in-part of Ser. No. 502,243, Jul. 13, 1995, Pat. No. 5,691,934.

[51] Int. Cl.$^6$ .................................................. G11C 11/24
[52] U.S. Cl. ................................... 365/149; 365/102
[58] Field of Search ................................. 365/149, 102

[56] References Cited

U.S. PATENT DOCUMENTS

| | | |
|---|---|---|
| 2,823,368 | 2/1958 | Avery . |
| 4,023,148 | 5/1977 | Heuber et al. . |
| 4,920,513 | 4/1990 | Takeshita et al. ............ 365/149 |
| 5,063,539 | 11/1991 | Rallapalli . |
| 5,267,192 | 11/1993 | Nogami . |
| 5,357,465 | 10/1994 | Challa . |
| 5,361,225 | 11/1994 | Ozawa . |
| 5,408,431 | 4/1995 | Challa . |
| 5,414,658 | 5/1995 | Challa . |
| 5,471,087 | 11/1995 | Buerger, Jr. . |
| 5,483,482 | 1/1996 | Yamada et al. ............ 365/149 |
| 5,508,955 | 4/1996 | Zimmer et al. . |

FOREIGN PATENT DOCUMENTS 241899  12/1983  Japan ................................. 365/102

OTHER PUBLICATIONS

Neil H. E. Weste, AT&T Bell Laboratories and Kamran Esgraghian, University of Adelaide; Principles of CMOS VLSI Design A System Perspective; 1995; Chapter 8, pp. 362–364; by AT&T Bell Laboratories, and Kamran Eshraghian; United States and Canada.

Primary Examiner—David C. Nelms
Assistant Examiner—F. Niranjan
Attorney, Agent, or Firm—David H. Carroll

[57] ABSTRACT

A memory element that includes a stored charge element coupled to a bi-directional voltage dropping element that exhibits substantially definite voltage drops when conducting in each direction is the basis for a family of memory cells and circuits. An extremely compact dynamic memory cell (200) capable of being stacked includes a capacitor (204) or any other suitable stored charge device, and a voltage dropping element such as a Zener diode (208), a pair of parallel, reverse-connected diodes (910, 920), or any other suitable voltage dropping device having substantially definite voltage drop thresholds when conducting in each direction. Another type of dynamic memory (1000) is read through a transistor (1020) to provide non-destructive reads. Another type of dynamic memory (1200) has column bit lines (1212) that are shared by adjacent cells having memory elements (1230, 1240). An SRAM cell (1300, 1400) is made of a latch (1310) that is accessed through a memory element (1320, 1420). A dynamic register (1500, 1700) is made from several stages (1510 and 1550, 1710 and 1750), each of which includes a master stage (1520, 1720) followed by a slave stage (1530, 1730). The master and slave stages contain memory elements. The various circuits are operated using suitable voltages and voltage sequences.

86 Claims, 19 Drawing Sheets

▫ V(01)  • V(02)  ▼ V(11)  ▲ V(12)  ○ V(100)

▫ V(110)

▫ V(120)

MEMORY ELEMENT AND METHOD OF OPERATION THEREOF

CROSS-REFERENCE TO RELATED APPLICATIONS

This is a continuation-in-part of application Ser. No. 08/502,243, filed Jul. 13, 1995, now U.S. Pat. No. 5,691,934.

BACKGROUND OF THE INVENTION

1. Field of the Invention

The invention relates generally to digital memory, and more particularly to basic memory elements, various dynamic memories, static memories, and registers based on these basic memory elements, and operation thereof.

2. Description of Related Art

A variety of approaches to achieving electronic memory have been used over the years, with the trend being toward smaller memory elements, smaller memory cells, and more dense memory arrays. While greater speed is generally desired, some technologies have sacrificed speed in favor of small size. For example, one type of memory that has enjoyed widespread use in the electronics industry is the dynamic random access memory, or DRAM, which is based on a dynamic memory cell. The dynamic memory cell typically has a capacitor, which stores digital information as a charge, in series with a selection transistor, and typically provides volatile data storage. A typical DRAM architecture is shown in FIG. 1. A memory cell array 30 includes an array of dynamic memory cells. A binary address is applied to the address decoder 10, the output lines of which control a word selector circuit 20. The output lines of the word selector circuit 20 are word lines of the memory cell array 30. Bit drivers 50 are used in conjunction with the word selector circuit 20 to write data to the cells of the array 30, and bit detectors 40 are used in conjunction with the word selector circuit 20 to read data from the cells of the array 30.

A typical one-transistor dynamic random access memory cell array is shown in FIG. 2. The select transistors 112, 114, 116, 122, 124 and 126 typically are MOS type, and the capacitors 113, 115, 117, 123, 125 and 127 typically are inversion layer type. The gates of the select transistors 112, 114, 116, 122, 124 and 126 are respectively connected to the row lines ROW 0, ROW 1, . . . , ROW 63, ROW 64, ROW 65, . . . , and ROW 127, and their drains are connected to the bit line.

During a read operation, the select transistor connected to the addressed row line is turned on and the charge in the series-connected capacitor is redistributed between the capacitor and the bit line capacitance. The bit line swing is detected by the sense/refresh circuit 130, which typically is a gated flip-flop. Because the read operation is destructive, the sense/refresh circuit 130 also functions as a cell refresh amplifier. The memory array of FIG. 2 is split into two sections 110 and 120 with respective bit line halves A and B, to reduce the bit line capacitance as seen from the addressed memory cell and to take advantage of the symmetry of the balanced detector in the sense/refresh circuit 130.

The READ/REWRITE cycle begins with the column select, $V_{FF}$, and the sense line set low. The bit line halves A and B are precharged to $V_{REF}$ through transistors 111 and 121. One of the memory cells, e.g. the cell composed of select transistor 112 and capacitor 113, is gated by a Row Select signal, e.g. select signal ROW0, causing a slight voltage perturbation on the bit line half A. The cross-coupled feedback lines of the flip-flop in the sense/refresh circuit 130, which is composed of transistors 132 and 134, are connected to the bit line halves A and B through transistors 131 and 133 by raising $V_{FF}$, and the flip-flop is enabled by raising the sense line. Upon assertion of the sense line, the flip-flop goes from a quasi-stable state to a final state determined by the slight difference in voltage of the bit line halves A and B. Next, the column select signal is asserted to read the final state of the flip-flop in the sense/refresh circuit 130, which appears on lines SENSE_OUT and SENSE_OUT_B.

Because of the regenerative action of the flip-flop in the sense/refresh circuit 130, the data line half to which the selected memory cell is connected is driven all the way to a high or low voltage, depending on the state of the selected memory cell. The driven half of the data line recharges the selected memory cell.

Because of the small size and low power consumption of the dynamic memory cell, DRAM memory is typically more dense than other types of random access memories. As the industry strives for even greater memory capacity, a dynamic memory cell that would make possible the fabrication of higher capacity memories with the same fabrication processes as used for conventional DRAM memories would be particularly advantageous.

As the industry strives for yet more compact and faster circuits, a whole class of circuits that incorporate memory elements could be significantly improved by use of smaller and faster memory elements.

SUMMARY OF THE INVENTION

The memory element of the present invention is a particularly compact element that is advantageous for use in a variety of memory cells and circuits. For example, a dynamic memory cell based on the memory element is both smaller and stackable, thereby permitting the fabrication of DRAM memories that are more dense than conventional DRAM memories fabricated with the same process. The memory element includes a voltage dropping element that may be realized in, for example, a diode rather than a transistor. Diodes are both more primitive electronically than transistors, and are smaller than transistors in terms of the chip area they occupy. Because of their more primitive nature, diodes permit manufacturing tolerances to be eased even while achieving more dense memories, or significantly more dense memories to be achieved using the same manufacturing tolerances. Also because of their simplicity, diodes require fewer manufacturing steps than transistors, which reduces fabrication cost and increases yield. In addition, the operating characteristics of semiconductor diodes involve an exponential relationship between the voltage and current, as compared to a quadratic relationship for similar MOSFET transistor-based memories. Hence, leakage current losses and losses during cell access are reduced over equivalent transistor-based memories, resulting in higher-performance circuits. SRAMs implemented using the novel memory elements instead of access transistors are smaller and faster. Dynamic registers using the novel memory elements in place of transistors are smaller and switch more rapidly due to the lower resistance characteristics of diodes over transistors. Moreover, because of the lower resistance there will also be less power consumption. Prior art registers have precharge transistors connecting the gate capacitance of the pull-down transistors to the precharge line, and pass transistors connecting the drains of the pull-down transistors to the gates of the next stage pull-down transistors. Typically, the pull-down transistors are connected to a single ground line instead of separate select lines.

These and other advantages are realized in the present invention, which in one embodiment is a memory comprising a first stored charge element, a first charge input path coupled to a terminal of the first stored charge element, and a first charge output path coupled to the terminal of the first stored charge element. The first charge input path is a charge path into the first stored charge element and has a substantially definite voltage drop threshold above which conduction occurs with no significant deterioration over time and below which significant conduction does not occur. The first charge output path is a charge path from the first stored charge element and has a substantially definite voltage drop threshold above which conduction occurs with no significant deterioration over time and below which significant conduction does not occur.

In a further embodiment, the stored charge element of the memory is, for example, a capacitor (including in the case of integrated circuits discrete integrated circuit capacitors or capacitive parts of other types of integrated circuit structures such as transistors), and the first charge input path and the first charge output path of the memory are opposite directions through a bi-directional voltage dropping element such as, for example, a Zener diode or series-connected ordinary diodes. The substantially definite voltage drop threshold in one of the two directions may in principle be zero.

In yet another embodiment, the memory further comprises an amplifying valve such as, for example, a MOSFET transistor, having a control terminal coupled to the second terminal of the first stored charge element, a first current terminal coupled to the first access node, and a second current terminal coupled to a memory read node. This arrangement is advantageous for non-destructive reading, for example.

In other embodiments, the first stored charge element, the first charge input path, and the first charge output path form in combination a first dynamic memory cell, and the memory is expanded by combining the first dynamic memory cell with a second dynamic memory cell having a second stored charge element, a second charge input path, and a second charge output path. In one such embodiment, the charge output path of the first dynamic memory cell is coupled to a first column bit line, the charge input path of the first dynamic memory cell and the charge output path of the second dynamic memory cell are coupled to a second column bit line, and the charge input path of the second dynamic memory cell is coupled to a third column bit line. This arrangement advantageously reduces the number of column bit lines. In a further embodiment wherein a voltage $V_H$ across the first and second stored charge elements is indicative of a first logical state and a voltage $V_L$ across the first and second stored charge elements is indicative of a second logical state, the memory further comprises means for maintaining the second column bit line nominally offset from the first column bit by $V_H-V_L$, and means for maintaining the third column bit line nominally offset from the second column bit by $V_H-V_L$.

In another embodiment, the memory further comprises a latch having an input/output terminal coupled to the charge input and output paths of the memory. This arrangement is advantageous for use as an SRAM cell, for example.

In yet another embodiment, the memory further comprises an amplifying valve having a control terminal coupled to the charge input and output paths of the memory, a first current terminal coupled to the first access node, and a second current terminal coupled to a stage output node, wherein the second memory access node is coupled to a precharge line and the third memory access node is coupled to a stage input node. This arrangement is advantageous for use as a stage of a dynamic register, for example.

In yet another embodiment, the memory includes a plurality of N two-terminal memory cells having respective stored charge elements, charge input paths, and charge output paths. The N memory cells are linked in a closed loop chain such that neighboring memory cells are coupled to one another. The substantially definite voltage drop thresholds of the charge input paths of the N memory cells are substantially equal to a value $V_I$, and the substantially definite voltage drop thresholds of the charge output paths of the N memory cells are substantially equal to a value $V_O$, $V_I$ and $V_O$ being related to a high value of stored voltage $V_H$ of the memory cells and a low value of stored voltage $V_L$ of the memory cells by the expression $V_H-V_L \leq (V_I+V_O)(N-2)/N$.

A further embodiment of the present invention is a method of controlling voltage across a stored charge element so as to indicate a particular one of a plurality of different logical states. Current is flowed during a first interval through a first current path having a first substantially definite voltage drop threshold above which conduction occurs with no significant deterioration over time and below which significant conduction does not occur to increase voltage across the stored charge element to a first voltage. Current is flowed during a second interval through a second current path having a second substantially definite voltage drop threshold above which conduction occurs with no significant deterioration over time and below which significant conduction does not occur to decrease voltage across the stored charge element to a second voltage, the second voltage being less than the first voltage. Flow of current through the first and second current paths is blocked by use of the first and second substantially definite voltage drop thresholds during an interval following and contiguous with at least one of the first and second intervals.

In a further embodiment of the method, the first and second current paths are in opposite directions through a common physical structure such as, for example, a Zener diode, while in an alternative embodiment the first and second current paths are through different structures such as, for example, respective ordinary diodes, that share a common node at a terminal of the stored charge element.

In a further embodiment of the method, the first and second voltages across the stored charge element are indicative of respective logical states. In an alternative embodiment, current is flowed during a third interval through the first current path to increase voltage across the stored charge element and again flowed during a fourth interval through the second current path to decrease voltage across the stored charge element to a fourth voltage greater than the second voltage. The second voltage is indicative of a first logical state while the fourth voltage is indicative of a second logical state different than the first logical state.

In yet another embodiment of the method, the first and second interval current flowing steps comprise establishing first and second voltage differentials. The first voltage differential is established across a series combination of the first current path and the stored charge element, and is greater than the first substantially definite voltage drop threshold by an amount in effect equal to a first predetermined charge voltage across the stored charge element. The second voltage differential is established across a series combination of the second current path and the stored charge element, and is greater than the second substantially definite voltage drop threshold by an amount in effect equal to a second predetermined charge voltage across the stored charge element, the second predetermined charge voltage being less than the first predetermined charge voltage.

Another embodiment of the method further comprises applying the voltage across the stored charge element to a control terminal of an amplifying valve, wherein the amplifying valve has a first conductance characteristic when the voltage across the stored charge element indicates a particular one of the plurality of logical states and has a second conductance characteristic different from the first conductance characteristic when the voltage across the stored charge element indicates another particular one of the plurality of logical states.

Another embodiment of the method further comprises establishing a logical state of the latch through at least one of the first and second current paths, and detecting the logical state of the latch through at least one of the first and second current paths.

Another embodiment of the method further comprises applying the voltage across the stored charge element to a control terminal of an amplifying valve. In this method, the first interval current flowing step comprises establishing a first voltage differential across a series combination of the first current path and the stored charge element wherein the amplifying valve has a first conductance characteristic, the second interval current flowing step comprises establishing a second voltage differential across a series combination of the second current path and the stored charge element wherein the amplifying valve has a second conductance characteristic to indicate a first logical state, and determining a conductance characteristic of the amplifying valve to indicate an output logical state, the output logical state being a first logical state when the conductance characteristic of the amplifying valve is the second conductance characteristic.

Yet another embodiment of the method further comprises linking N two-terminal memory cells in a closed loop chain of N memory cells, the memory cells storing one of a high value of voltage $V_H$ to indicate a first logical state and a low value of voltage $V_L$ to indicate a second logical state different than the first logical state, performing the first interval flowing step wherein the substantially definite voltage drop thresholds of the charge input paths of the N memory cells are substantially equal to a value $V_I$, and performing the second interval flowing step wherein the substantially definite voltage drop thresholds of the charge output paths of the N memory cells are substantially equal to a value $V_O$. $V_I$ and $V_O$ are related by the expression $V_H - V_L \leq (V_I + V_O)(N-2)/N$.

In a further embodiment, various voltages across the stored charge element representative of various logical states are established by charging and discharging the stored charge element at appropriate times and to different degrees.

BRIEF DESCRIPTION OF THE DRAWINGS

In the drawings, wherein like reference characters indicate like parts.

DETAILED DESCRIPTION OF THE PREFERRED EMBODIMENT

Figure 3:
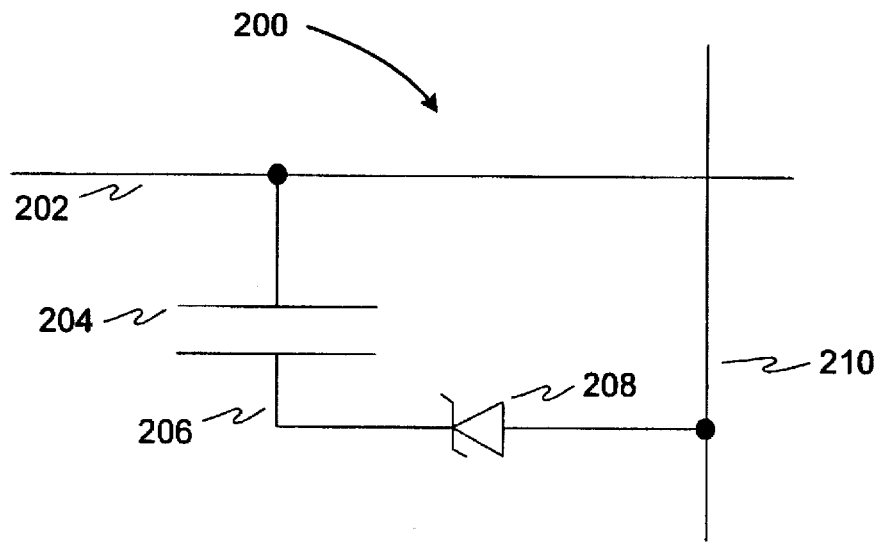
FIG. 3 is a memory cell based on a memory element in accordance with the present invention.

An extremely compact dynamic memory cell 200 is shown in FIG. 3. The memory cell 200 includes a memory element, viz. a capacitor 204 connected in series with a Zener diode 208, connected between a row select line 202 and a column bit line 210. The term Zener diode is commonly used to mean any diode with a non-destructive reverse breakdown voltage, and this is the meaning used here. In combination, the capacitor 204 and the Zener diode 208 serve as the memory element for the memory cell 200.

In general terms, the novel memory element includes any suitable stored charge element inclusive of devices (including in the case of integrated circuits ("IC") discrete IC components and suitable portions of IC structures) and circuits that provide a stored charge function, coupled with any suitable bi-directional voltage dropping element. A suitable bi-directional voltage dropping element is any element inclusive of devices (including in the case of integrated circuits discrete IC components and suitable portions of IC structures) and circuits that exhibits substantially definite voltage drop thresholds for significant conduction to occur in each direction, and which do not significantly deterioration over time. The substantially definite voltage drop threshold in one of the two directions may in principle be zero. The stored charge element and the voltage dropping element are coupled between access nodes, at least one of which represents the logical value stored by the memory element. Examples of suitable stored charge elements include the capacitor 204, as well as capacitive structures such as the gates of MOSFETs. Suitable bi-directional voltage dropping elements include the Zener diode 208, as well as reverse breakdown semiconductor diodes, metal-semiconductor junction (so-called Schottky barrier) diodes, vacuum tube diodes, and circuits such as back-to-back connected diodes.

The memory element can also be viewed in general terms as a stored charge element in combination with at least two charge paths, one being a charge input path having a substantially definite voltage drop threshold that does not significantly deterioration over time, and another being a charge output path having a substantially definite voltage drop threshold that does not significantly deterioration over time. The logical value of the cell is represented at a node of the stored charge element, a node in the charge input path, or a node in the charge output path. To operate the memory element, voltage on the stored charge element is increased by flowing current on the charge input path, and voltage on the stored charge element is decreased by flowing current on the charge output path. Various voltages across the stored charge element (which may be negative, zero, or positive values) representative of various (two or more) logical states are established by charging and discharging the stored charge element at appropriate times and, if desired, to different degrees. Once a desired voltage representative of a desired logical state is established on the stored charge element, it is maintained (except for leakage) by preventing current flow on the charge input and output paths. The charge input and output paths may be implemented by a single device such as a Zener diode, or respectively by two devices such as two regular diodes, or by a combination of devices. The logical state of the memory element is determined when desired by sensing the voltage on the stored charge element using either destructive or nondestructive techniques.

Operation of the memory cell 200 is in accordance with this general view of the memory element. Reading the memory cell 200 is, in general terms, based on the recognition that the stored charge element, i.e. the capacitor 204, nominally has either charge state $V_1$ or charge state $V_2$ (a charge state may be a negative, zero, or positive value), charge state $V_1$ being greater than charge state $V_2$, and the voltage dropping element, i.e. the Zener diode 208, has two voltage thresholds $V_{sb}$ and $V_{bs}$ when conducting in different directions, $V_{sb}$ being in the direction of the select line 202 to the bit line 210, and $V_{bs}$ being in the direction of the bit line 210 to the select line 202. To sense the charge state of the stored charge device, precharge the bit line 210 (a precharge may be a negative, zero, or positive value) to establish a voltage differential between the select line 202 and the bit line 210. Where $V_s$ is the voltage on the select line and $V_b$ is the voltage on the bit line, the voltage differential is established in the select-to-bit direction when $V_s > V_b$, and is established in the bit-to-select direction when $V_b > V_s$. Establish the magnitude of the voltage differential to cause a perturbation on the bit line 210 for at least one of the logical states, the perturbation being a discharge onto the bit line 210 if $V_s > V_b$, and a discharge from the bit line 210 if $V_b > V_s$, and also of a sufficient magnitude to be detected by a sense amplifier. The magnitude of the voltage differential may, if desired, be made sufficient to cause discharges for both logical states, provided one discharge is heavier than the other and the sense amplifier is able to distinguish between the larger and the smaller charge perturbation. For a discharge from the cell to the bit line, $V_s + V_1 > V_b + V_{sb}$. Alternatively, for a discharge from the bit line to the cell, $V_b > V_s + V_{bs} + V_2$. A combination of voltage differential in one direction followed by a differential in the other direction may also be used to perturb the bit line up or down selectively depending on the charge state $V_1$ or $V_2$, for detection by an appropriately designed sense amplifier.

Writing to the memory cell 200 for erasing or programming the cell is, in general terms, based on the recognition that the charge in the storage charge element is increased by creating a sufficient voltage differential in the bit-to-select direction $V_b > V_s$ so as to exceed the $V_{bs}$ voltage threshold of the voltage dropping element, and the charge in the storage charge element is decreased by creating a sufficient voltage differential in the select-to-bit direction $V_s > V_b$ so as to exceed the $V_{sb}$ voltage threshold of the voltage dropping element. To write a charge state corresponding to V* into the memory cell 200, where V* is either $V_1$ or $V_2$, create a voltage differential between the select line and the bit line in the appropriate direction to raise or lower the voltage as desired on the stored charge element. For example, if $V_1 > V_2$, the relationship of $V_s$ to $V_b$ is determined by $V_s + V^* + V_{bs} = V_b$ to raise the voltage on the stored charge element to V*, and is determined by $V_s + V^* = V_{sb} + V_b$ to lower the voltage on the stored charge element to V*. The voltage differential is maintained so that the cell 200 charges to V* and the voltage dropping element ceases to conduct.

When the memory cell 200 is used in a memory array, additional voltage relationships are established to avoid reading or writing memory cells on a particular select line of a DRAM memory, whether during idling or when reading or writing other rows or even when reading or writing to other cells on the particular select line. When the maximum range of stored voltages in the memory cell 200 ranges from a high of $V_1$ to a low of $V_2$, the voltage difference between the two cell access nodes, viz. the word select line 202 and the column bit line 210, swings during access (reading or writing) from $V_1 + V_{bs}$ to $V_2 - V_{sb}$ for a range of $V_1 - V_2 + V_{bs} + V_{sb}$. However, when the memory cell 200 is not being accessed, the maximum permissible voltage range to avoid disturbing the voltage stored on the capacitor 204 is from $V_2 + V_{bs}$ to $V_1 - V_{sb}$, for a range of $V_2 - V_1 + V_{bs} + V_{sb}$. The requirement of a maximum permissible voltage range to avoid disturbing the state of the memory cell 200 imposes the following constraints on the voltages across the memory cell 200.

First, consider a single memory cell 200 whose two access nodes are connected to respective control lines. During access, a voltage differential in the range of $V_1 - V_2 + V_{bs} + V_{sb}$ is created across the two control lines. However, other memory cells in the memory array, whether or not connected to these two control lines, may experience a voltage swing of no more than $V_2 - V_1 + V_{bs} + V_{sb}$ if the control lines are to be useful in accessing cells independently and one at a time.

Next consider the case where the two control lines are linked to one access node each of two other cells, which in turn are the end cells in a chain of (N−1) linked cells. A chain of linked cells means a sequence of cells wherein each cell in the chain shares one common control line with the next cell in the chain, and each control line is connected to two such cells, thereby forming a closed loop chain of N control lines and N cells. The $V_1 - V_2 + V_{bs} + V_{sb}$ swing across the accessed cell is divided across the (N−1) cells in the chain which are not being accessed so that each of them sees no more than $V_2 - V_1 + V_{bs} + V_{sb}$ voltage swing each, for a total swing in the chain of $(N-1)(V_2 - V_1 + V_{bs} + V_{sb})$. Thus if $V_1 - V_2 + V_{bs} + V_{sb} \leq (N-1)(V_2 - V_1 + V_{bs} + V_{sb})$ then $V_1 - V_2 \leq$ $(V_{bs}+V_{sb})(N-2)/N$. This formula expresses the maximum allowable voltage difference between the high voltage and low voltage stored in each cell as a function of the voltages $V_{bs}$ and $V_{sb}$ of the voltage dropping element, and the number of cells N in a closed loop of cells. In a complex circuit the size N of the smallest such closed loop chain of cells in the circuit will determine the maximum stored voltage range.

Figure 4:
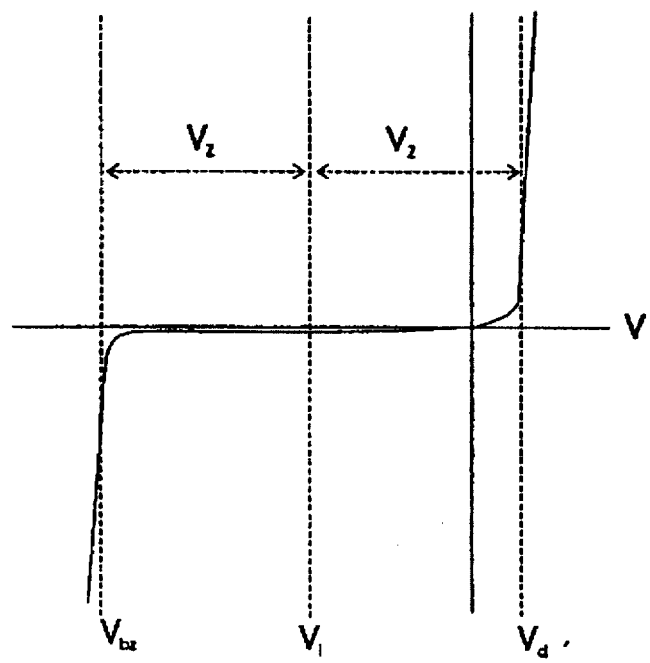
FIG. 4 is a graph showing certain voltage characteristics of the memory cell of FIG. 3.

For use in a memory such as a DRAM memory, the structure of the memory cell 200 is replicated millions of times and arrayed in rows and columns as in conventional one-transistor MOSFET DRAM memories to form a memory integrated circuit. A row of cells is accessed by asserting the select line for that row, and the columns are accessed by precharging their bit lines. The cell read operation is a destructive read, necessitating a write-back operation to restore the original value. Circuits (not shown) suitable for controlling the select and bit line operations in such a memory are similar to those used in traditional one-transistor cell DRAMs, but are modified to apply suitable voltage sequences during idle periods and during memory read/rewrite and write operations. The structure of the memory cell 200 is fabricated with any of numerous processes commonly used to fabricate conventional semiconductor memories.

a voltage at node 206 of $V_c=V_i+V_z$. The voltage $V_z$ is preferably half the difference between the forward turn-on voltage and the point of Zener breakdown of the diode, $V_{bz}$, so $V_{bz}+V_d=2V_z$. Consequently $V_i=V_{bz}-V_z=V_z-V_d$. These voltages are shown in FIG. 4.

While the row and column are not being accessed, the select line 202 and the bit line 210 are at $V_i$. Thus the Zener diode 208 sees either no drop if the value stored in the memory cell 200 is a logical 0, or a drop of $V_z$ in the reverse direction if the value stored in the memory cell 200 is a logical 1. Therefore, no charge loss occurs from the capacitor 204 to the bit line 210. Assuming $V_{bz}=5.0$ volts and $V_d=0.7$ volts, and assuming ideal device and line characteristics, the voltage $V_c$ at node 206 for logical 0 and 1 during the idle, read (of other cells not in the same row or column), and rewrite (of other cells not in the same row or column) modes of operation are listed in Table 1, wherein $V_{rsl}$ is the voltage on the select line 202 and $V_{cbl}$ is the voltage on the bit line 202.

TABLE 1

| NON-SELECTED CELL | | | | | | |
|---|---|---|---|---|---|---|
| LOGICAL 0 | | | PARAMETER | LOGICAL 1 | | |
| IDLE MODE | READ MODE | REWRITE MODE | $V_{bz}=5.0$ volts $V_d=0.7$ volts | IDLE MODE | READ MODE | REWRITE MODE |
| 2.15 | 2.15 | 2.15 | $V_{rsl}$ | 2.15 | 2.15 | 2.15 |
| 2.15 | 2.15 | 2.15 | $V_c$ | 5.0 | 5.0 | 5.0 |
| 2.15 | 2.15 | 2.15 | $V_{cbl}$ | 2.15 | 2.15 | 2.15 |

An illustrative voltage sequence for operating the memory cell 200 of FIG. 3 in its various modes in a DRAM memory is now described under an assumption of ideal devices and conditions. The voltages used in practice vary in accordance with the semiconductor fabrication processes and the device structures used for the memory cell 200, in accordance with well known principles. The bit is stored as a charge on the capacitor 204, and appears as voltage $V_c$ at node 206. As shown in FIG. 4, the Zener diode 208 has a Zener breakdown voltage of magnitude $V_{bz}$, and a typically small forward turn-on voltage of magnitude $V_d$. When the cell is not being accessed, the select line 202 is held at a voltage $V_i$, which preferably is halfway between $V_{bz}$ and $V_d$. The charge stored on the capacitor 204 for a logical 0 is zero, resulting in a voltage at node 206 of $V_c=V_i$. The charge stored on the capacitor 204 for a logical 1 is the voltage $V_z$, resulting in To read the charge on the capacitor 204, the select line 202 is lowered to $V_i-V_z-V_d$. If the voltage at node 206 was $V_i+V_z$ (i.e. logical 1 with a charge of $V_z$ volts on the capacitor), it is now $V_i-V_d$. Since the drop from the bit line 210 to node 206 is $V_i-(V_i-V_d)=V_d$, no charge transfers from the bit line 210 to the capacitor 204. If, on the other hand, the voltage at node 206 was $V_i$ (i.e. logical 0 with no charge on the capacitor), it is now $V_i-V_z-V_d$, or a drop of $V_z+V_d$, in the forward direction. Zener diode 208 turns on in the forward direction, and the capacitor 204 discharges the bit line 210, thereby dropping its voltage slightly. The slight voltage drop is picked up by a sense amplifier (not shown). Node 206 charges until its voltage reaches $V_i-V_d$. The net increase in voltage at node 206 is $\Delta V_c=V_i-V_d-(V_i-V_z-V_d)=V_z$. The voltage $V_c$ at node 206 for logical 0 and 1 during the read mode of operation are listed in Table 2.

TABLE 2

| SELECTED CELL | | | | | | |
|---|---|---|---|---|---|---|
| LOGICAL 0 | | | PARAMETER | LOGICAL 1 | | |
| IDLE MODE | READ MODE | REWRITE MODE | $V_{bz}=5.0$ volts $V_d=0.7$ volts | IDLE MODE | READ MODE | REWRITE MODE |
| 2.15 | −1.4 | 5.0 | $V_{rsl}$ | 2.15 | −1.4 | 5.0 |
| 2.15 | −1.4 → 1.45 | 7.85 → 5.0 | $V_c$ | 5.0 | 1.45 | 7.85 |
| 2.15 | 2.15 | 0 | $V_{cbl}$ | 2.15 | 2.15 | 2.85 |

To insure that the cell does reach preferably a full logical 1 value, the bit line 210 is briefly driven to $V_i$ after the cell value is sensed to eliminate the effect of any dip in voltage caused by the reading process. The read of the logical 0 value is destructive, so the device must be rewritten. All the capacitors 204 in the selected row have a logical 1 value after a read operation, since they have a $V_z$ volt differential with the select line. To write a logical 0 back to the capacitor 204, the select line 202 is raised to a voltage $V_i+V_z$ while the bit line 210 is lowered to a voltage $V_i-V_z+V_d$. The Zener diode 208 now operates in the reverse breakdown Zener mode since there is a $V_b=2V_z-V_d$ voltage differential between the select line 202 and the bit line 210. Charge on the capacitor 204 is removed until $V_c=V_i+V_z$, so that the capacitor 204 becomes completely discharged. To write a logical 1 to the capacitor 204, raise the select line 202 to a voltage $V_i+V_z$ and raise the bit line 210 to $V_i+V_d$. Because of the $V_z$ volt differential across the capacitor 204 with the select line 202, the voltage at the Zener diode 208 becomes $V_{bz}=2V_z-V_d$ volts above the bit line 210, which does not allow the Zener diode 208 to discharge the capacitor 204 further. The logical 1 is retained. The voltage $V_c$ at node 206 for logical 0 and 1 during the rewrite mode of operation are listed in Table 2.

The select lines 202 of the non-selected rows are kept at $V_i$ during the Read cycle. When a rewrite of a logical 0 is done, the voltage differential across the Zener diodes 208 in the memory cells 200 associated with the non-selected rows but on the same column as the rewrite is either $V_z-V_d<V_{bz}$ for a stored logical 0 or $2V_z-V_d=V_{bz}$ in the reverse direction for a stored logical 1, so no charge is transferred from the other cells. When a rewrite of a logical 1 is done, the voltage differential across the Zener diodes 208 in the memory cells 200 associated with the non-selected rows but on the same column as the rewrite is either $V_d$ forward for a stored logical 0 or $V_z-V_d<V_{bz}$ in the reverse direction for a stored logical 1, so no charge is transferred from the other cells. The voltage $V_c$ at node 206 for logical 0 and 1 during the idle, read, and rewrite mode of operation for memory cells 200 that are on non-selected rows but share columns with a selected row are listed in Table 3.

Since some current leakage across the diodes occurs over time, the memory cells 200 preferably are refreshed periodically, as in a standard DRAM. This is done by performing the above complete Read cycle on every row in the memory, one row at a time, thus bringing the voltage levels back to full value.

An alternate embodiment of the accessing process, whether for a Read cycle or a Write cycle, allows individual cells to be accessed. The modification is as follows. In order to read the charge, the select line 202 is lowered to $V_i-V_z-V_d$, and if the cell is to be read, the corresponding bit line 210 remains at a voltage of $V_i$. Thus for the cell being accessed, the reading process is unchanged from the previous description. To prevent the other cells in the row from being accessed by their bit lines 210, these other bit lines 210 are lowered simultaneously with the select line 202 to a voltage of $V_i-V_z-V_d$, so that no charge is transferred into the other cells. Note that there is a drop of at most $V_i+V_z-(V_i-V_z-V_d)=2V_z-V_d=V_{bz}$ in the reverse direction across the diodes in the other rows (taking into consideration the possible stored charge for a logical 1), so they too do not discharge onto the bit lines 210. Thus individually chosen cells in a row can be accessed without accessing the other cells. If the cycle is a Read Cycle, these cells alone need to be rewritten with logical 0's if appropriate. If a logical 1 is to remain in the cell, the rewriting can be dispensed with. If a cell is to be written to, the reading process described above inserts a logical 1, while the writing process described previously places a logical 0. Only one or the other need be done if only a single cell is being accessed. Thus the Read and Write Cycles may be speeded up.

If only isolated cells are to be accessed, the number of sense amplifiers used is reduced by multiplexing, since one sense amplifier may be shared by many columns. The need to refresh the entire memory dictates how many sense amplifiers are needed, since refreshing one cell at a time is slow. Advantageously, this technique avoids the placing of a sense amplifier at each column.

EXAMPLE

Figure 5:
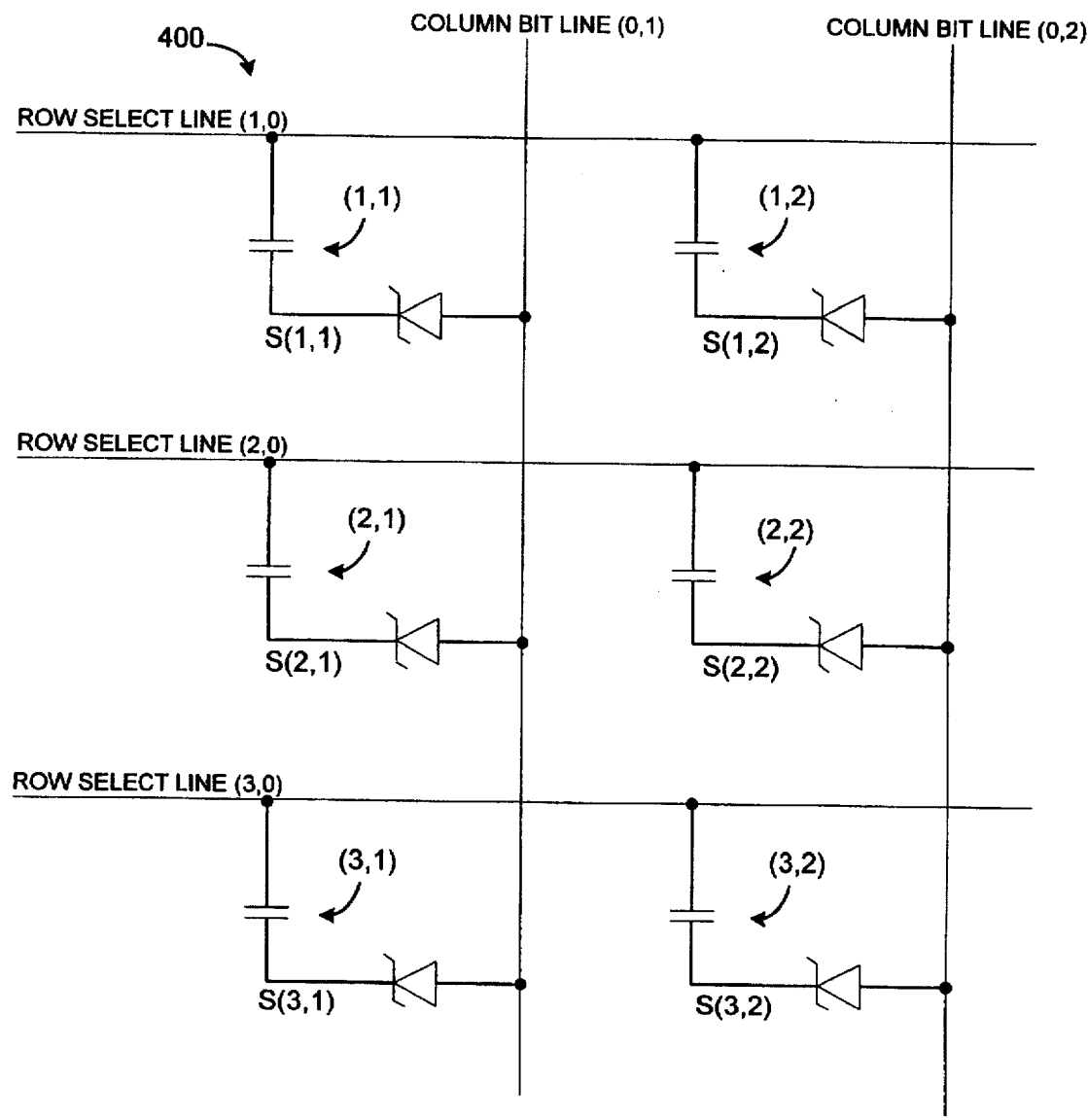
FIG. 5 is a schematic diagram of an array of memory cells like the memory cell of FIG. 3 suitable for use in a DRAM memory.

The circuit 400 shown in FIG. 5 represents an array containing memory cells of the type shown in FIG. 3. The

TABLE 3

| NON-SELECTED CELL ON SAME COLUMN AS SELECTED CELL | | | | | | |
|---|---|---|---|---|---|---|
| LOGICAL 0 | | | PARAMETER | LOGICAL 1 | | |
| IDLE MODE | READ MODE | REWRITE MODE | $V_{bz}$ = 5.0 volts $V_d$ = 0.7 volts | IDLE MODE | READ MODE | REWRITE MODE |
| 2.15 | 2.15 | 2.15 | $V_{rsl}$ | 2.15 | 2.15 | 2.15 |
| 2.15 | 2.15 | 2.15 | $V_c$ | 5.0 | 5.0 | 5.0 |
| 2.15 | 2.15 | 0(0) 2.85(1) | $V_{cbl}$ | 2.15 | 2.15 | 0(0) 2.85(1) |

Since the voltage changes on the select line 202, coupled with the bit line 210, result in a write, an entire row can be rewritten in this fashion. The above sequence of operations constitute a complete Read cycle, allowing individual cell values to be read while retaining at the end of the cycle the original values in every cell unchanged.

To perform a Write operation to a cell, the above Read cycle is performed in the same manner, except that when the cells are rewritten the one cell whose value is to be changed has the new value written into it instead of the old value. All other cells will retain the old values.

array contains six bits arranged in three rows of two bits each. The circuit 400 was simulated using a P-SPICE circuit simulation package available from MicroSim of Irvine, Calif., with the Zener Diode 208 specified as having a reverse breakdown voltage $V_{bz}$ of 5 volts and a forward turn-on voltage $V_d$ of 0.7 volts. The capacitor 204 was assigned a value of 15 femtofarads, and the bit line 210 was assigned an infinite capacitance consistent with a large line. The diode 208 was given a saturation current value of $I_s=4\times10^{-23}$ amps, corresponding to a small semiconductor diode of about 4 square microns. The reverse breakdown knee voltage of the diode was set at 5 volts, which corresponds to $V_{bz}=5$ volts. The stable high voltage at node 206 was found to be about 4.95 volts, and the stable low voltage was found to be about 2.2 volts. These values differ slightly from the values strictly dictated by the formulas set forth elsewhere herein because the values of $V_{bz}$ and $V_d$ are nominal values; for the Zener diode 208 of the simulation as well as actual Zener diodes, the turn on voltage is not a single voltage but in fact varies over a range of voltages. This causes some leakage until a stable value (defined as a value for which the leakage is insignificant except over very long periods of time) is obtained. The problem of long term leakage is handled by the refreshing process.

Figure 6:
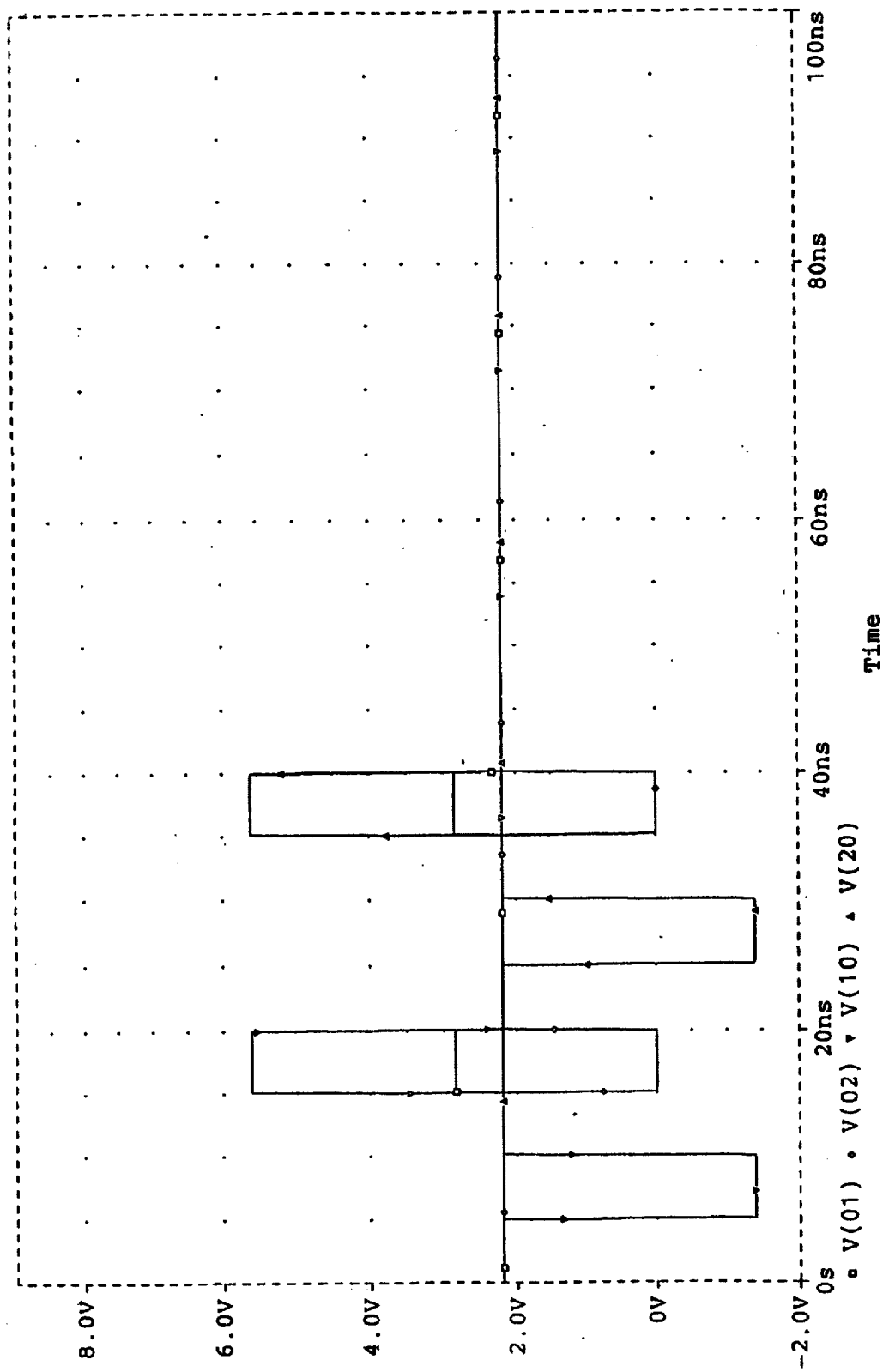
FIGS. 6, 7, 8 and 9 are graphs showing sequences of voltages to operate the memory array of FIG. 5 in various modes of operation.
Figure 7:
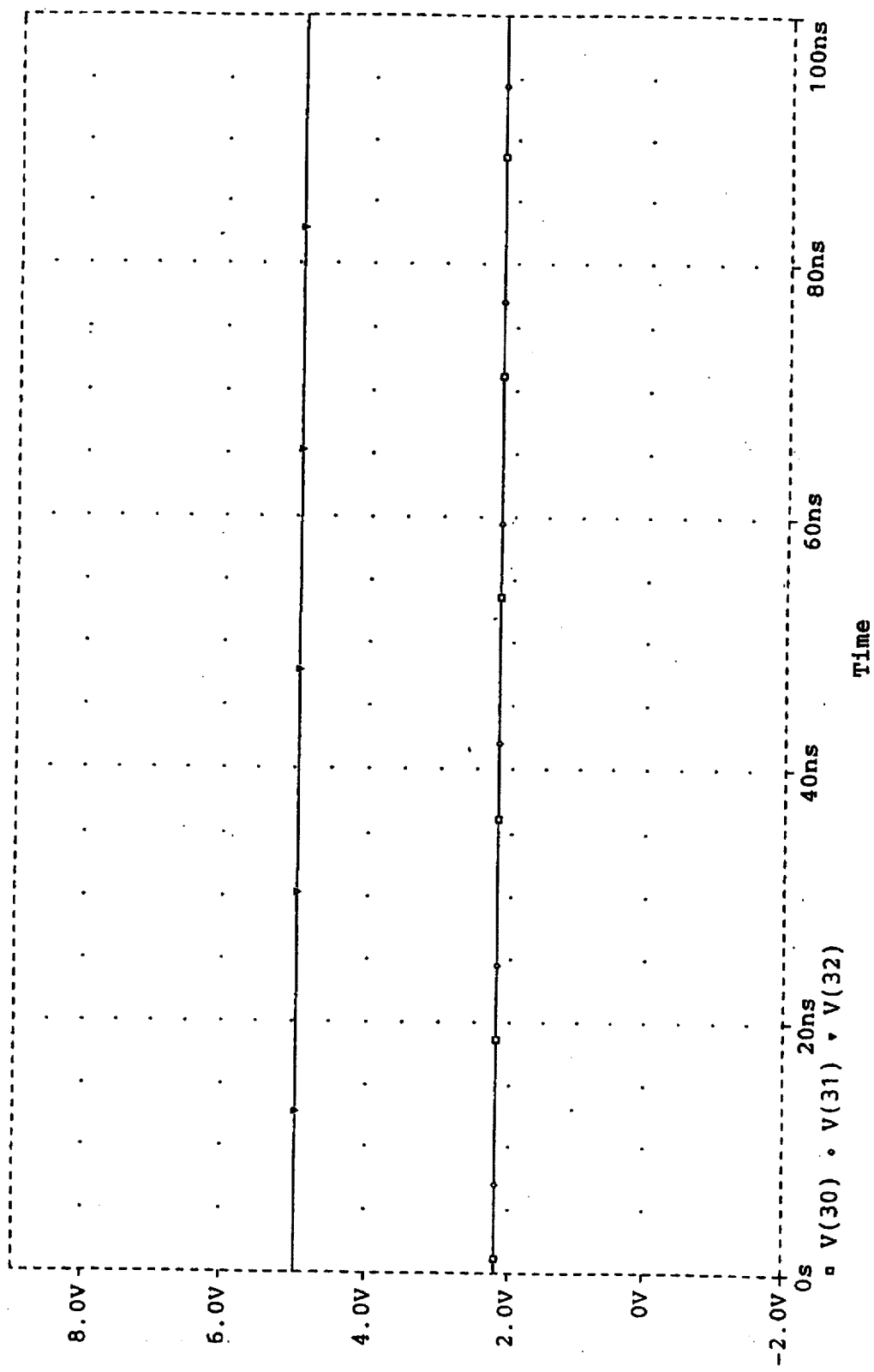
Figure 8:
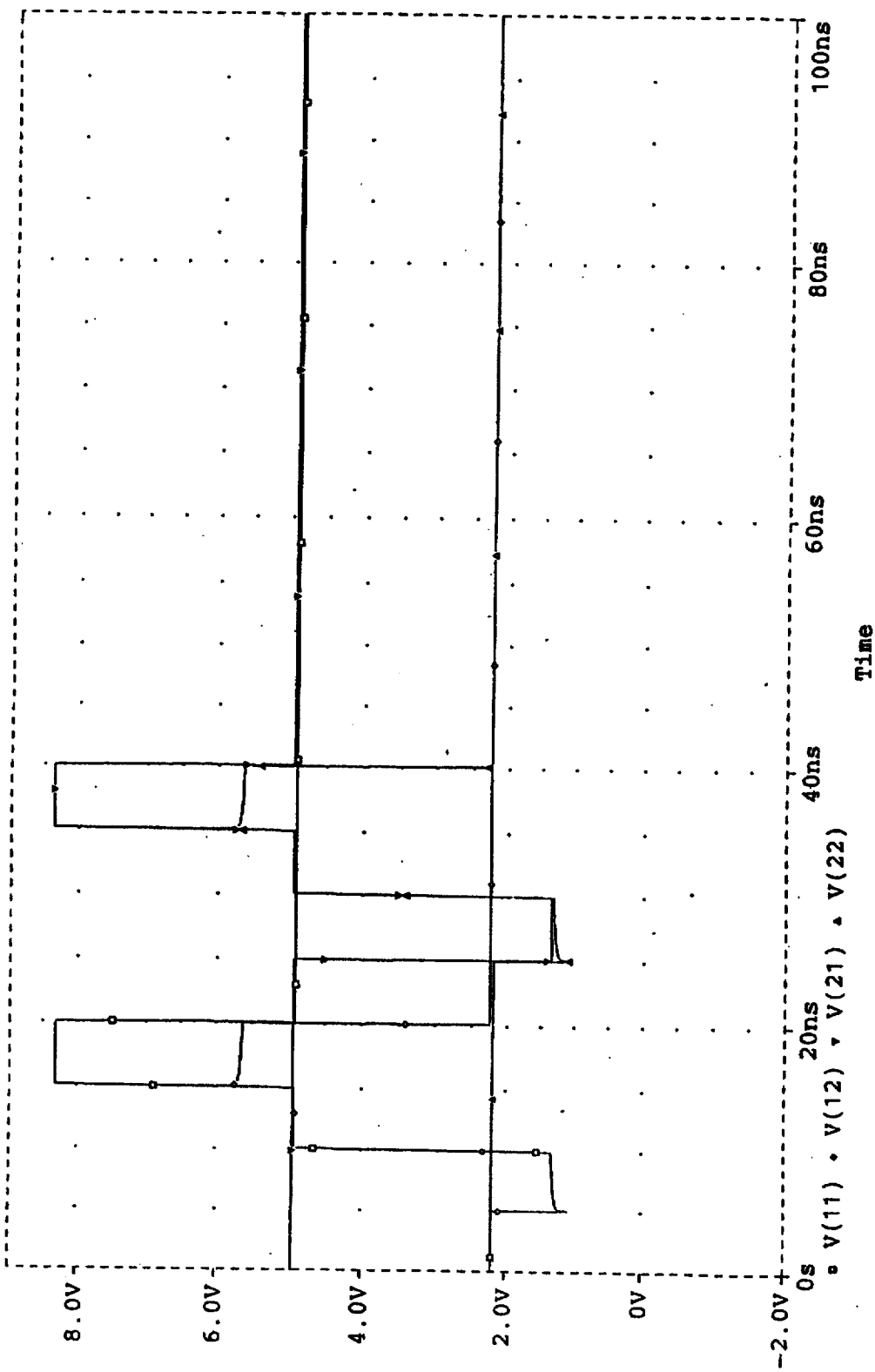

The simulations were run for a period of 100 ns (nanoseconds), with two complete cycles carried out during the period. The various voltages on the bit lines and the select lines of the circuit 400 during the period are shown in FIG. 6 and FIG. 7: V(0,1) and V(0,2) are the bit line voltages, and V(1,0), V(2,0) and V(3,0) are the select line voltages. The voltages on the nodes 206 of the various memory cells are shown in FIG. 7 and FIG. 8. In FIG. 8, V(1,1) and V(1,2) are the values at nodes S(1,1) and S(1,2) for the two cells of the first row (1,0); and V(2,1) and V(2,2) are the values at nodes S(2,1) and S(2,2) for the two cells of the second row (2,0). In FIG. 7, V(3,1) and V(3,2) are the values at nodes S(3,1) and S(3,2) for the two cells of the third row (3,0).

Initially, the memory cells (2,1) (row 2, column 1) and (3,2) (row 3, column 2) stored a logical 1 value so that node S(2,1) and node S(3,2) were at 4.95 volts. The other cells stored a logical 0 so that node S(1,1), node S(1,2), node S(2,2) and node S(3,1) were at 2.2 volts. In the first 20 ns a Write cycle was performed on row (1,0) involving the steps of reading the contents of the row, writing back the old value into cell (1,2), and overwriting cell (1,1) with a logical 1 at 4.95 volts. In the second 20 nanoseconds, a Read cycle was performed on row (2,0), involving the steps of reading and rewriting the contents of row (2,0). Row (3,0) was not accessed and its values were unaffected, except for slight leakage over time.

The first Read cycle was initiated with row (1,0), with V(1,0) being lowered from the idle voltage of 2.2 volts to −1.4 volts from 5 nanoseconds to 10 nanoseconds. Both V(1,1) and V(1,2) in FIG. 8 reached 1.4 volts, evidencing that a destructive read occurred. The destructive read became apparent at 10 nanoseconds when the select line returned to the idle voltage of 2.2 volts, as both V(1,1) and V(1,2) reached 4.95 volts. At 15 nanoseconds, the bit line voltage V(0,1) (FIG. 6) was raised to 2.85 volts, for a logical 1, while the bit line voltage V(0,2) (FIG. 6) was reduced to 0 volts, or logical 0. At the same time, the select line voltage V(1,0) was raised to 5.6 volts, so that V(1,1) (FIG. 8) rose to about 8.3 volts while V(1,2), (FIG. 8) fell to about 5.6 volts. Note that 5.6 volts is higher than the calculated 5 volts, since it was chosen to produce simulation stored charge voltages of 2.2 volts for a logical 0 and 4.95 volts for a logical 1 which most closely matched the predicted values. At 20 nanoseconds, the select line (1,0) and the bit line (0,2) returned to the idle voltage of 2.2 volts, causing V(1,1) to return to 4.95 volts, a logical 1, and causing V(1,2) to return to 2.2 volts, a logical 0.

During the period from 0 to 20 nanoseconds, the two cells in the second row, cell (2,1) and cell (2,2), were unchanged, with V(2,1) high (logical 1) and V(2,2) low (logical 0). Similarly, the two cells in the third row, cell (3,1) and cell (3,2), were unchanged, with V(3,1) low (logical 0) and V(3,2) high (logical 1). As the third row was never accessed in the simulation, cell (3,1) retained the logical 0 as V(3,1) and remained low throughout the simulation, while cell (3,2) retained a logical 1 as V(3,2) and remained high throughout the simulation; see FIG. 7. Note that both voltages V(3,1) and V(3,2) experienced a slow decay over time. Refresh is required to address this slow decay over time.

The second Read cycle was the same as the first Read cycle, but performed on row (2,0). V(2,0) was lowered to −1.4 volts from 25 to 30 nanoseconds, then raised to the idle voltage of 2.2 volts from 30 to 35 nanoseconds, then raised to 5.6 volts from 35 to 40 nanoseconds as V(0,2) was lowered to 0 volts, causing a logical 0 to be placed in cell (2,2) while cell (2,1) retained a logical 1. At just after 25 nanoseconds both V(2,1) and V(2,2) reached 1.4 volts, then at 30 nanoseconds rose to 4.95 volts, representing a logical 1. Note that V(2,2) was overwritten, since it was a logical 0 before this move. At 35 nanoseconds the rewriting process took place, and V(2,1) retained its logical 1 while V(2,2) was rewritten with a logical 0. At 40 nanoseconds the cycle ended with the values fixed at 4.95 volts for logical 1 or 2.2 volts for logical 0.

Figure 9:
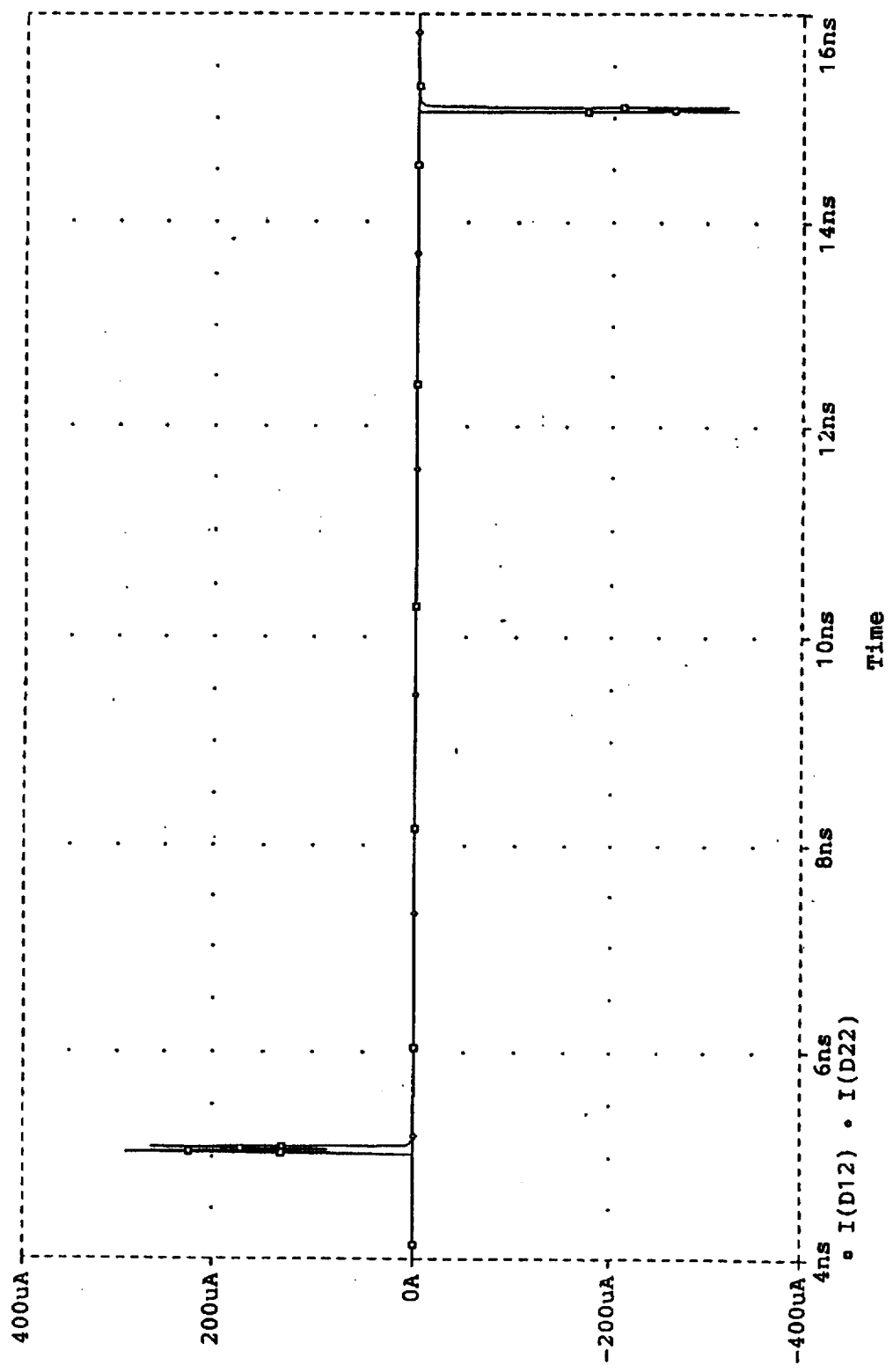

FIG. 9 is a plot of the currents through the diodes at cell (1,2) and cell (2,2). Since cell (2,2) was not accessed during the first 20 nanoseconds, its current is 0 mA. The current through the diode connected to cell (1,2) consisted of two short pulses of approximately 100 picoseconds each, the first one indicating charging of the cell due to the reading process, and the second indicating discharging of the cell as the cell is returned to its original value during rewriting. These currents, while small, are similar to the currents seen in typical conventional DRAM circuits and are readily detectable by standard sense-amplifier circuits of the type used in conventional ordinary one-transistor DRAMs.

Other Embodiments

Figure 10:
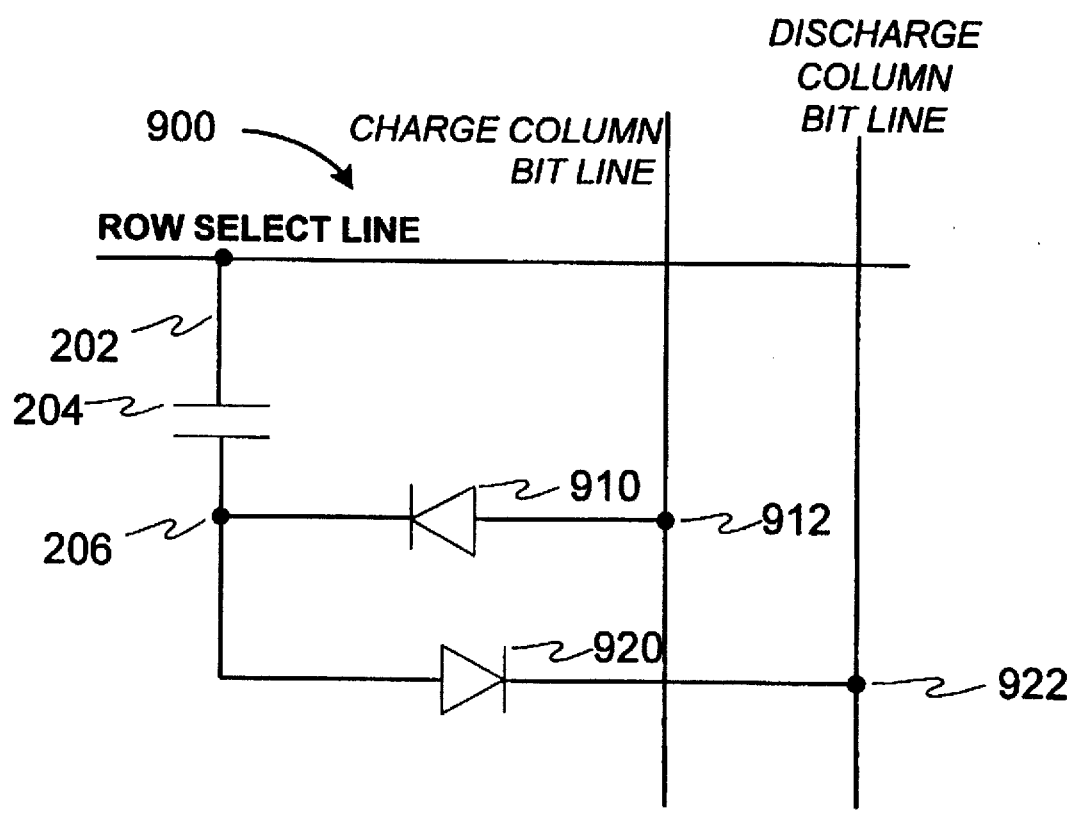
FIG. 10 is a schematic diagram of a memory cell based on another embodiment of a memory element in accordance with the present invention.

Another embodiment of a memory cell is illustrated in FIG. 10. In the memory cell 900 of FIG. 10, the Zener diode 208 of the circuit 200 (FIG. 3) has been replaced by two ordinary diodes, a charge diode 910 and a discharge diode 920. The charge diode 910 is connected to a charge bit line 912, and is forward-conductive from the line 912 to the capacitor 204. The discharge diode 920 is connected to a discharge bit line 922, and is forward-conductive from the capacitor 204 to the line 922.

When the memory cell 900 is used in a DRAM memory, the charge bit line 912 is, for example, used for the reading operation in the same manner as described above for a DRAM memory using the memory cell 200, with the same voltages applied to the bit line 912. The stored charge is accessed through diode 910, charging the cell capacitor 204 from the bit line 912. During the reading operation and when not accessing the memory, the discharge bit line 922 is held at a voltage at or above $V_i+2V_z$, thus insuring that no current flows into it from the stored charge which has been accessed even when the cell contents of the entire row are replaced by logical 1. To rewrite the row, the select line 202 is raised to a voltage of $V_i+V_z$. If a logical 1 is to be left in the cell 900, the bit line 922 is held at or above $V_i+2V_z$ so that its voltage is at or above the maximum voltage of the stored charge, which is also $V_i+2V_z$. If a logical 0 is to be written into the cell 900, the voltage of the corresponding bit line 922 is lowered to $V_i+V_z$ so that the stored charge is completely discharged through the diode 920. During this rewriting operation, the voltage at the charge bit line 912 is held at $V_i$ so that no current flows through it. Note that since the voltage at the discharge bit line 922 never drops below $V_i+V_z$, the cells in the other rows are not affected by the rewriting operation, since the maximum voltage at these stored charges is at $V_i+V_z$.

Figure 11:
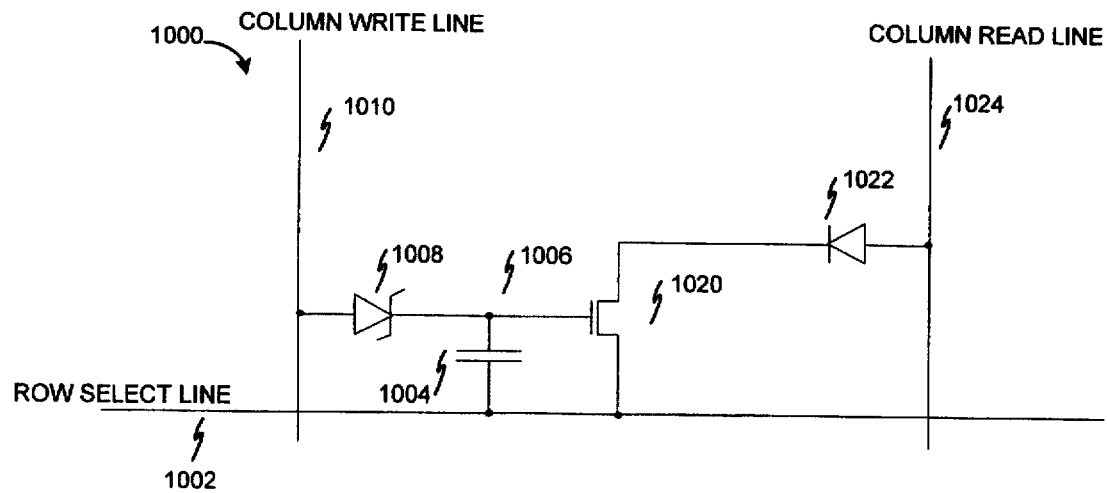
FIG. 11 is a schematic diagram of yet another embodiment of a memory cell in accordance with the present invention.

FIG. 11 shows the circuit of FIG. 3 combined with other circuit elements to provide a memory cell 1000 that has a high access speed and a non-destructive read when incorporated into a DRAM. A Zener diode 1008, which is similar to the Zener diode 208, and a capacitor 1004, which is similar in principle to the capacitor 204, are connected between a column write line 1010 and a select line 1002. A transistor 1020, preferably an n-channel MOSFET, has a gate connected to the Zener diode 1008 at node 1006, a drain connected to the select line 1002, and a source connected to the column read line 1024 through a diode 1022, and serves to isolate the capacitor 1006 during read operations. Preferably, the capacitor 1004 is the gate capacitance of the transistor 1020. The diode 1022 blocks conductance into the transistor 1020 from the select line to the column read line 1024.

Writing various logical states to the memory cell 1000 is done as described above for a DRAM incorporating the memory cell 200. Briefly, one logical state is represented by a high charge on the capacitor 1004, which is achieved by creating a sufficient voltage differential between the column write line 1010 to the row select line 1002 so as to exceed the voltage threshold of the Zener diode 1008 in the forward direction. Another logical state is represented by a low charge on the capacitor 1004, which is achieved by creating a sufficient voltage differential between the column write line 1010 to the row select line 1002 so as to exceed the voltage threshold of the Zener diode 1008 in the reverse direction. During writing, the column read line 1024 is held below the voltage of the select line 1002 and the other select lines (not shown) in the memory so that no conduction occurs into the transistor 1020 from the column read line 1024.

Reading of the memory cell 1000 is similar to the reading of the memory cell 200, except that the transistor 1020 rather than a capacitor is in the discharge path. Briefly, the column read lines, including the column read line 1024, are precharged and left floating. The select line 1002 of the accessed cell is lowered. The magnitude of the voltage differential between the column read line 1024 and the row select line 1002 of an accessed cell is such as to cause a discharge of the column read line 1024 through the transistor 1020 for one of the logical states, although other approaches such as described for the memory cell 200 may be used if desired. The column write lines are lowered for all columns during the Read operation to prevent discharge of the capacitances.

During idling, the column read line 1024 is held below the voltage of the select line 1002 so that no conduction occurs into the transistor 1020 from the column read line 1024.

Exemplary Circuits Incorporating the Described Memory Element

Figure 1:
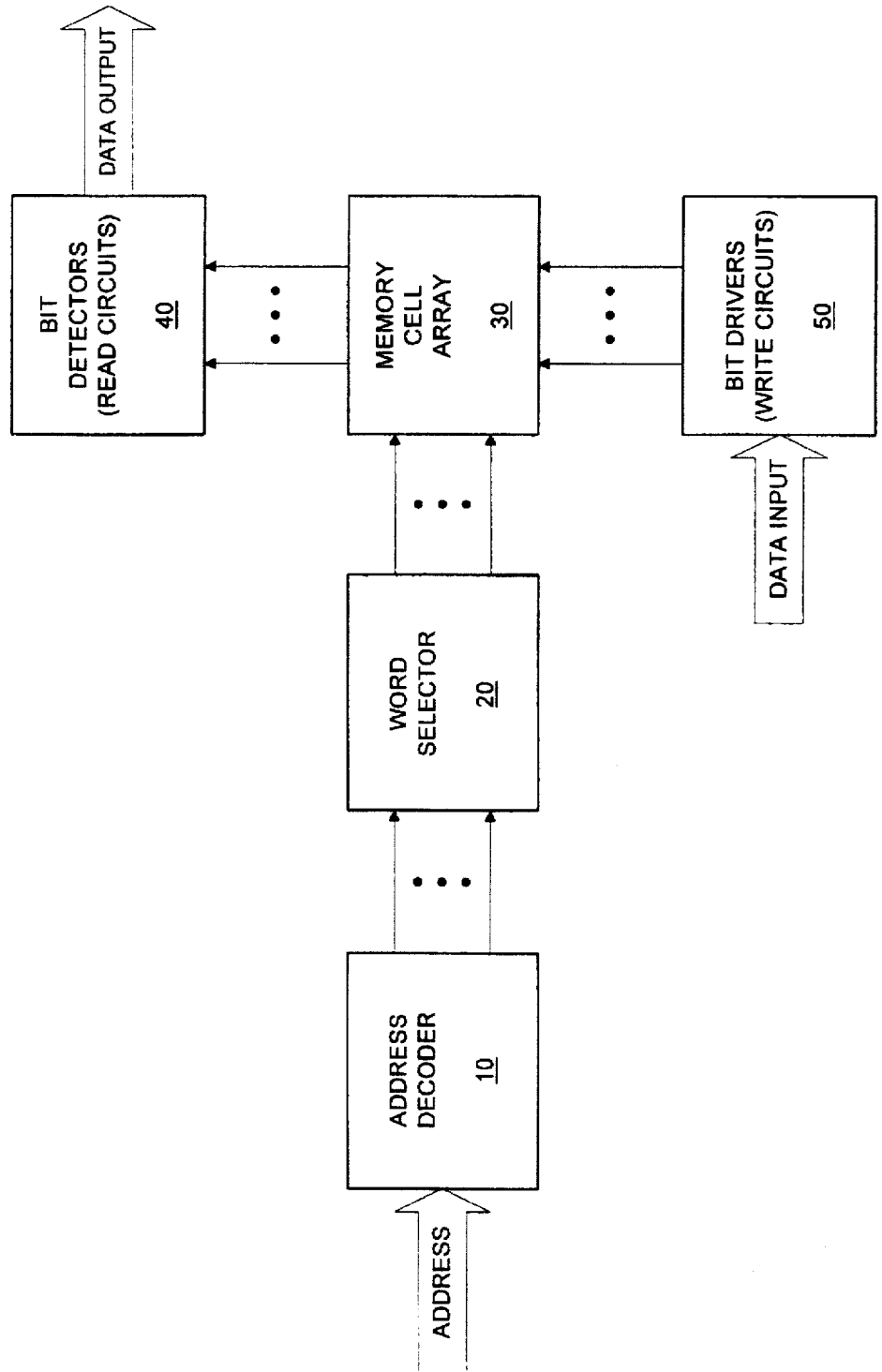
FIG. 1 is a block diagram of a prior art DRAM memory.
Figure 2:
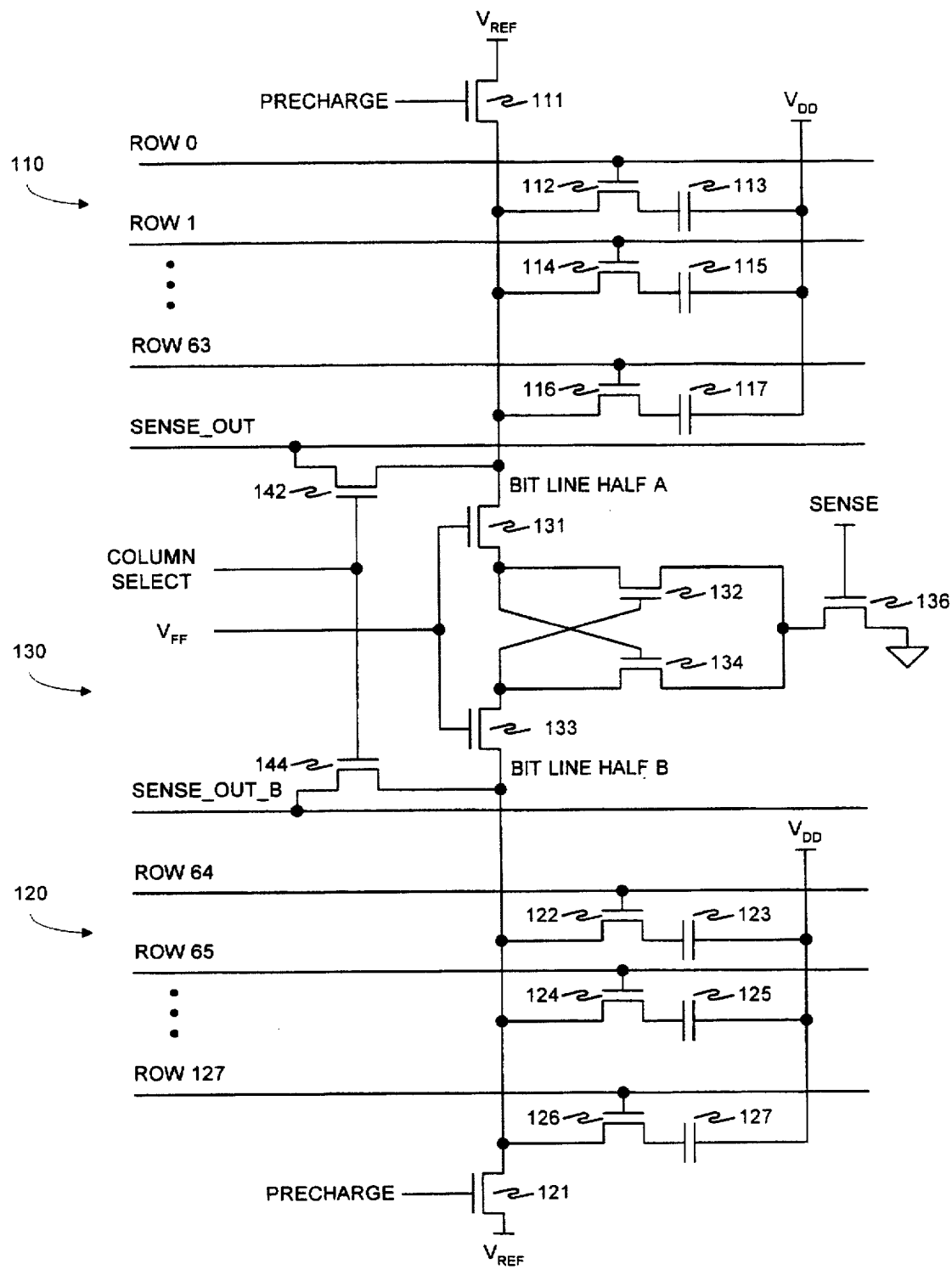
FIG. 2 is a schematic diagram of a prior art DRAM memory column.
Figure 12:
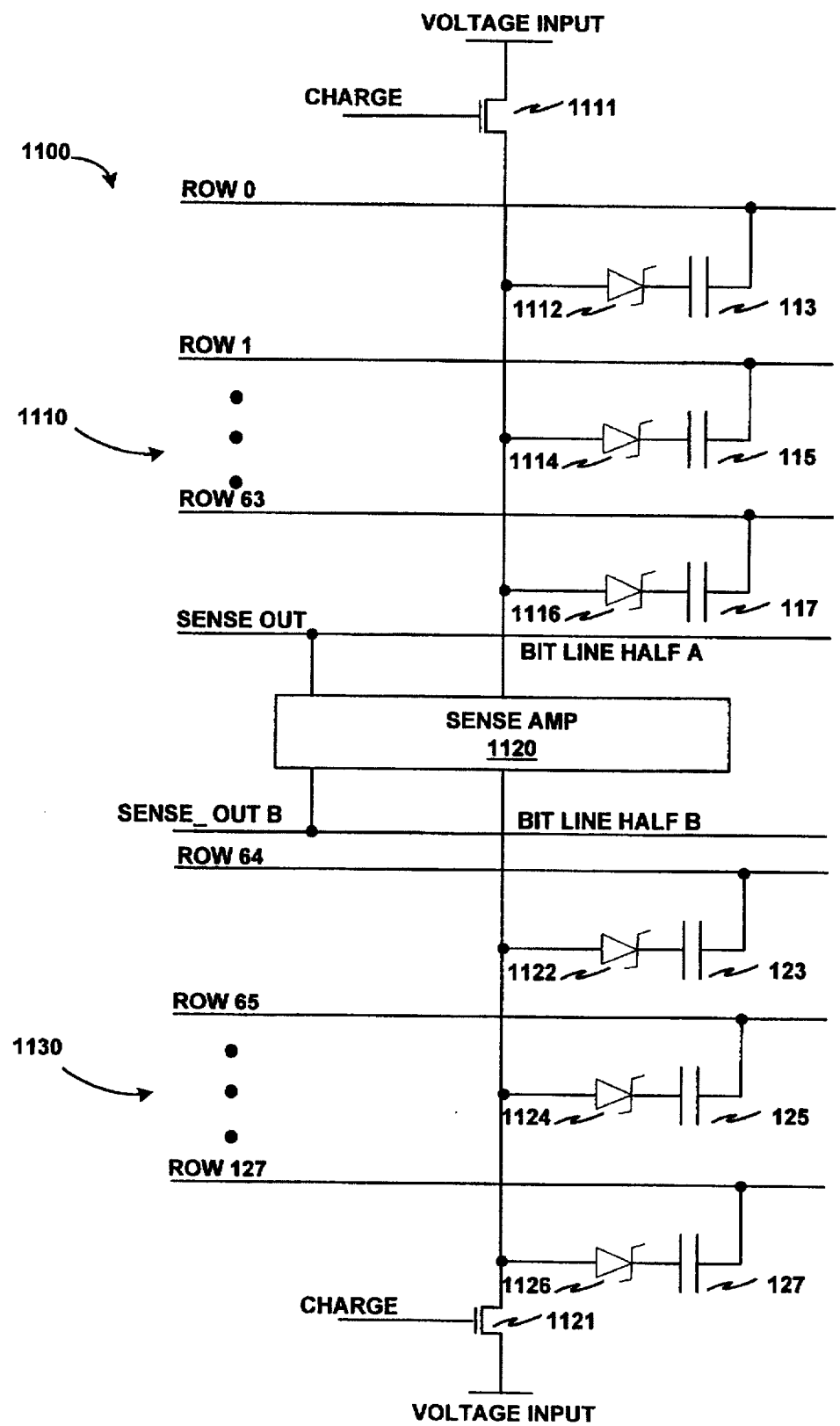
FIG. 12 is a schematic diagram showing the memory cell of FIG. 3 incorporated into a DRAM memory.

FIG. 12 shows a DRAM memory that incorporates the memory cell 200 of FIG. 3, which functions without change as a DRAM cell. The individual cell transistors 112, 114, 116, 122, 124 and 126 of the prior art circuit of FIG. 2, for example, are replaced by Zener Diodes 1112, 1114, 1116, 1122, 1124 and 1126. The capacitors 113, 115, 117, 123, 125 and 127 of FIG. 2 are connected to their corresponding ROW 0, ROW 1, ..., ROW 63, ROW 64, ROW 65, ..., and ROW 127 lines on one end and on the other end to the diodes 1112, 1114, 1116, 1122, 1124 and 1126, respectively. The PRECHARGE transistors 111 and 121 with drain voltage $V_{REF}$ are replaced by transistors 1111 and 1121 with gate input CHARGE and a drain voltage VOLTAGE INPUT which is used at various times in the cycle to input one of the required voltages by raising the CHARGE line while gating in the appropriate drain voltage. The sense amplifier 1120 is any suitable sense amplifier, such as, for example, a differential sense amplifier similar to the sense amplifier 130 of FIG. 2, or a pair of charge balance sense amplifiers such as described in Weste, Neil H. E. and Eshraghian, Kamran, Principles of CMOS VLSI Design: A System Perspective, Addison-Wesley Publishing Company, Reading, Mass., 1985, pp. 362–364, which is incorporated herein by reference. Where the sense amplifier 1120 is a differential voltage sensing device and where the cell being accessed can either leave the Bit Line undisturbed or lower its voltage to some slightly lower voltage $V_L$, the proper sensing of a logical 1 requires that the unused Bit Line Half be precharged to a voltage in between $V_i$ and the lower voltage $V_L$. Thus a logical 1 is sensed unless the cell charge lowers the voltage of the Bit Line Half being accessed. External power supply circuits well known to the art (not shown) are gated to feed the appropriate voltages in the required sequences to both the Rows and bit lines.

Figure 13:
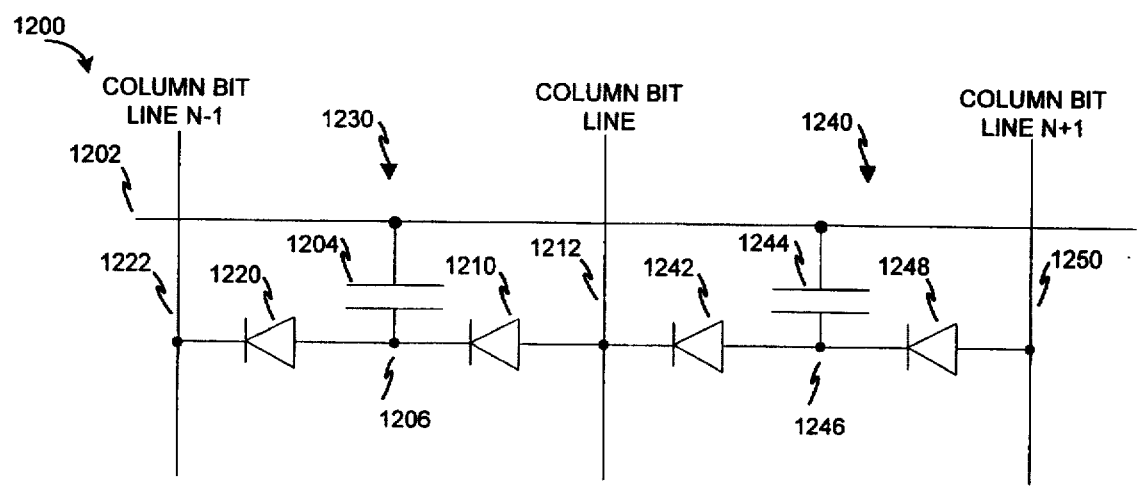
FIG. 13 is a schematic diagram showing the memory cell of FIG. 10 incorporated into a DRAM memory having shared control lines.

FIG. 13 shows adjacent cells 1230 and 1240 of a DRAM memory array 1200 that are based on the memory cell 900 of FIG. 10. The cells 1230 and 1240 function as a DRAM cell. The memory array 1200 is organized into one-bit cells arrayed in rows and columns, as in conventional one-transistor MOSFET DRAM memories, and the circuits (not shown) for controlling the row select and column bit line operations are similar to those used in conventional one-transistor cell DRAMs. Advantageously, the number of column lines per cell is reduced from two by creating a chain of two or more cells in each row, so that a chain of length n has only n+1 column lines. The column lines in between cells in the chain are shared between adjacent cells.

As shown in FIG. 13, the cell 1230 includes a capacitor 1204 and a charging diode 1210 and a discharging diode 1220 connected to the capacitor 1204 at node 1206. The charge on the cell 1230 appears at the node 1206. Illustratively, the charging diode 1210 functions as a read diode and the discharging diode 1220 functions as a write diode. The cell 1240 includes a capacitor 1244 and a charging diode 1248 and a discharging diode 1242 connected to the capacitor 1244 at node 1246. The charge on the cell 1240 appears at the node 1246. Illustratively, the charging diode 1248 functions as a read diode and the discharging diode 1242 functions as a write diode. A row select line 1202 is connected to the capacitors 1204 and 1244 of the cells 1230 and 1240. Column bit lines 1212 and 1222 are connected to diodes 1210 and 1220 respectively of the cell 1230, with respect to which they function as, illustratively, read and write bit lines. Column bit lines 1250 and 1212 are connected to diodes 1248 and 1242 respectively of the cell 1240, with respect to which they function as, illustratively, read and write bit lines.

The memory array 1200 operates under the following voltage conditions. If, for example, the cell 1230 is the nth cell in the array and cell 1240 is the nth+1 cell in the array, and assuming the cell 1230 is not to be accessed, the voltage $V_{cn}$(idle) on its read line, the column bit line 1212, is maintained at a value that is insufficient to charge the cell 1230 from its lowest possible voltage. Assuming that the charging diode 1210 turns on at a voltage $V_T$, for a cell minimum stored charge voltage at node 1206 of $V_n$(min) the read column bit line voltage $V_{cn}$ at idle is determined by the expression $V_{cn}(idle)<V_n(min)+V_T$. Note that $V_{cn}$(idle) can freely drop below this voltage to discharge the cell 1240, the nth+1 cell, without affecting cell 1230, the nth cell. In addition, assuming cell 1240, the nth+1 cell, is not being accessed, $V_{cn}$(idle) must not be low enough to discharge the cell 1240 from its highest possible voltage $V_{n+1}$(max). Hence, the read column bit line voltage $V_{cn}$ at idle is further determined by the expression $V_{cn}$(idle)>$V_{n+1}$(max)-$V_T$. Thus, when neither cell 1230 nor 1240 is being accessed, $V_{n+1}$(max)<$V_n$(min)+$2V_T$. To provide an adequate margin of safety, and approximating the charging and discharging diode voltages $V_T$=0 for all diodes, the formula can be simplified to $V_{n+1}$(max)<$V_n$(min). Thus for each successive cell in a chain of cells, the high state voltage of the nth+1 cell must not exceed the low state voltage of the preceding nth cell.

According, each succeeding cell has its voltages, including the column bit line voltages which access it, offset by the high-to-low state voltage swing, V(max)-V(min). The row select line voltage during idle is arbitrary since the cells are only connected to it through capacitances. Only the voltage shift during access matters, and this is the same for all cells in the row.

A consideration in choosing the length of a chain of cells in a row is the problem of hot electrons. Hot electrons cause a cell to discharge across the thin dielectric into the row select line if the voltage across the capacitor is too high. This can be minimized by choosing the row select line idle voltage to be half way between the two extreme voltages of the cells in the chain, given the worst case of a logic high state in the first cell in the chain, and a logic low state in the last cell in the chain. Given current process technology, the length n of the chain preferably is limited to only a few cells, for example four cells, so that the voltage range in the chain is not too large and the hot electron effect is avoided.

Note that a chain of length four has a net 1.25 column bit lines per cell. If the cells are compact enough so that the spacing of the column bit line wires is the limiting factor in determining area, the cells will have about 1.25 times the area of an implementation which uses the absolute minimum of one column bit line per cell. Accordingly, compact cell arrangements are achieved using ordinary diodes instead of the more complex reverse-breakdown diodes.

Figure 14:
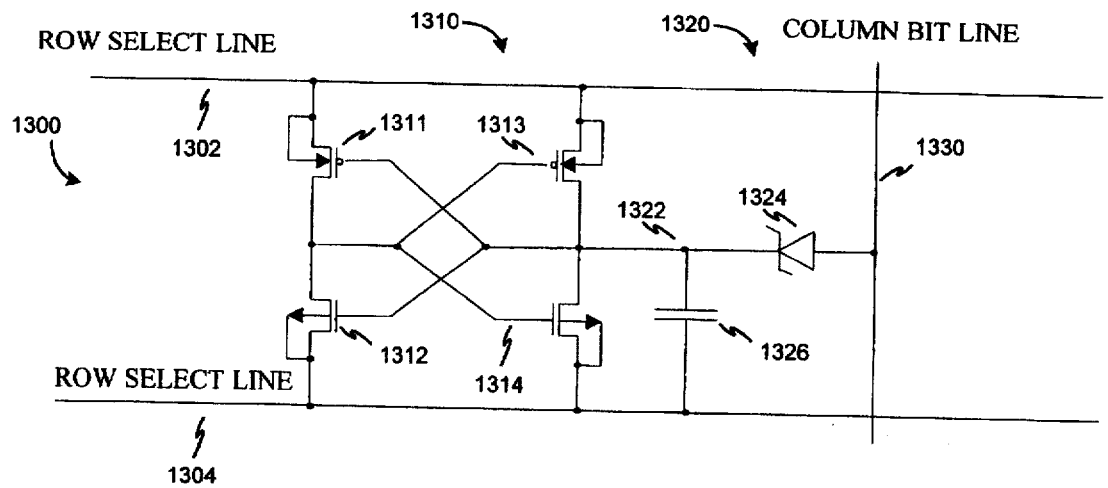
FIGS. 14 and 15 are schematic diagrams of SRAM cells that are based on the memory element used in the memory cell of FIG. 3.
Figure 15:
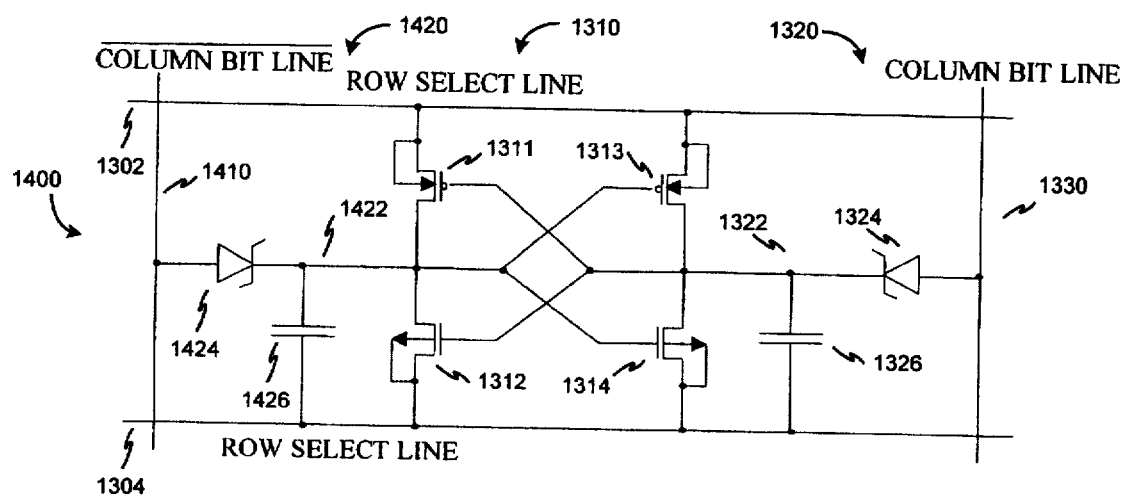

FIG. 14 and FIG. 15 show SRAM cells 1300 and 1400 that are based on the memory cell 200 of FIG. 3. The SRAM cells 1300 and 1400 are identical except that the SRAM cell 1300 is accessed at only one side of the latch, while the SRAM cell 1400 is accessed at both sides of the latch, which is particularly suitable for use with a differential sense amplifier. The latch is formed from standard cross-connected inverters connected between two row select lines 1302 and 1304. Specifically, one inverter of the latch 1310 includes a p-channel MOSFET 1311 and an n-channel MOSFET 1312, while the other inverter of the latch 1310 includes a p-channel MOSFET 1313 and an n-channel MOSFET 1314. The inverters are shown implemented in CMOS technology, although any standard SRAM cell latch technology is suitable. A memory cell 1320 that includes a Zener diode 1324 connected to a capacitor 1326 at node 1322 is connected between the row select line 1304 and the column line 1330, and is connected to the cross-coupling point between the transistors 1313 and 1314 at node 1322. Preferably and advantageously, the capacitor 1326 is the gate capacitance of the transistors 1311 and 1312. The Zener diode 1324 replaces a cell access transistor. The SRAM cell 1400 includes a second memory cell 1420, which is connected between the row select line 1304 and a complement column line 1410. The second memory cell 1420 includes a Zener diode 1424 connected to a capacitor 1426 at node 1422, and is connected to the cross-coupling point between the transistors 1311 and 1312 at node 1422. Preferably and advantageously, the capacitor 1426 is the gate capacitance of the transistors 1313 and 1314. The Zener diode 1424 replaces a cell access transistor.

The lower row select line 1304, which is connected to the latch $V_{ss}$ nodes, and the column lines 1330 and 1410 are controlled in the same way as the select line 202 and the bit line 210 of the memory cell 200. The upper row select line 1302, which is connected to the latch $V_{dd}$ nodes, operates just as the lower row select line does, following it exactly except always offset by a voltage of $V_{dd}$-$V_{ss}$ so that the latch operates normally but with varying $V_{ss}$ and $V_{dd}$ voltages. Note that although the circuits 1300 and 1400 use the same method of cell access and the same diode-capacitor memory element as the memory cell 200, they are SRAM cells.

The SRAM cells 1300 and 1400 are operated so that the nodes 1322 and 1422 are charged through the Zener diodes 1324 and 1424, but may be discharged either through the Zener diodes 1324 and 1424 or through the latch 1310. Alternatively, ordinary diodes can be used instead of the Zener diodes 1324 and 1424, but in this case the nodes 1322 and 1422 are charged through the ordinary diodes and discharged through the latch 1310.

Figure 16:
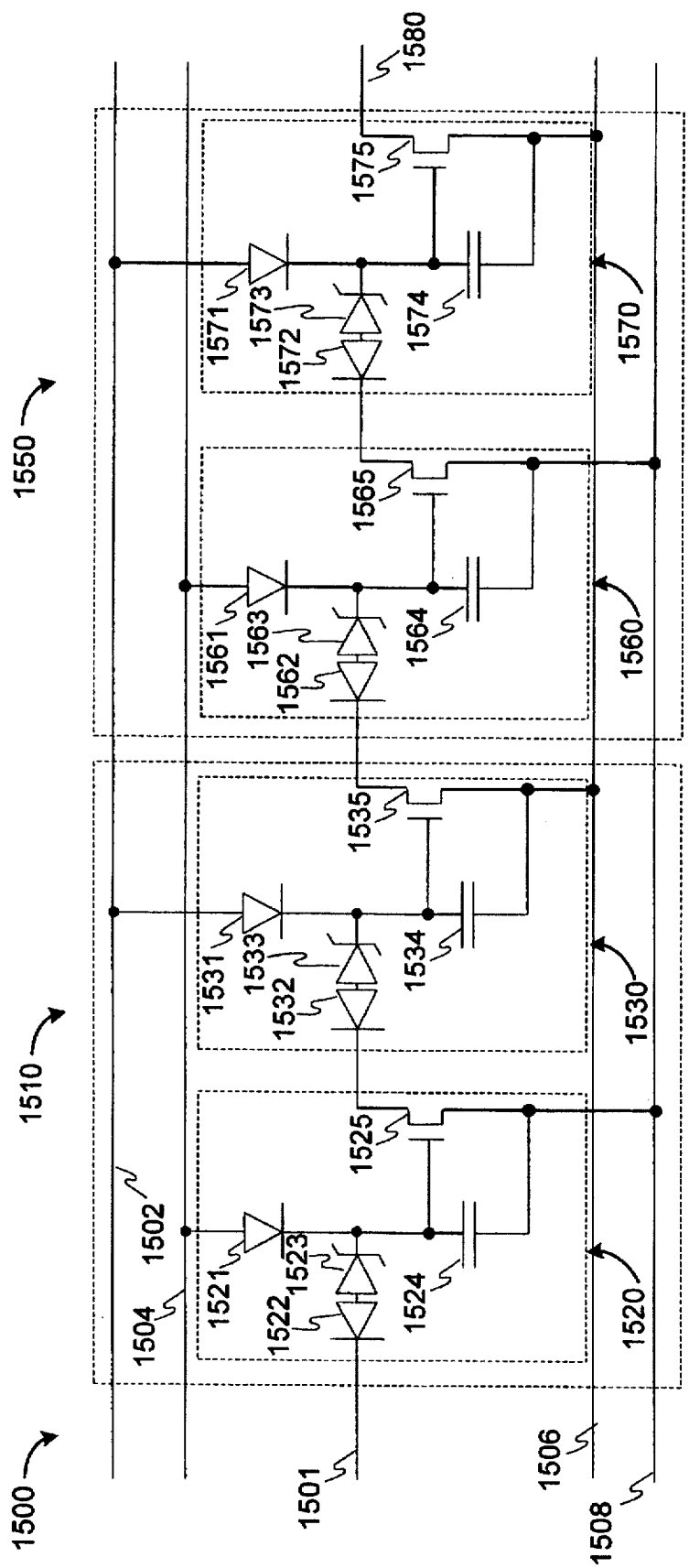
FIG. 16 is a schematic diagram showing a dynamic register based on the memory element used in the memory cell of FIG. 10.

FIG. 16 illustrates a dynamic clocked logic circuit, or dynamic register 1500, which uses reverse breakdown diodes and enhancement mode transistors to create dynamic register stages. FIG. 16 shows two dynamic register stages 1510 and 1550, each of which has two duplicate circuits in a master-slave configuration. For example, the dynamic register stage 1510 has a master stage 1520 and a slave stage 1530, and the dynamic register stage 1550 has a master stage 1560 and a slave stage 1570. The input of the master stage 1520 is data input line 1501, and the output of the slave stage 1570 is data output line 1580. The data is stored as charges on the capacitors 1524, 1534, 1564 and 1574, which preferably are the respective gate capacitances of transistors 1525, 1535, 1565 and 1575.

The stage 1520 includes a Zener diode 1523, which is similar to the Zener diode 208, connected in series to a capacitor 1524, which is similar in principle to the capacitor 204. A transistor 1525, preferably an n-channel enhancement mode MOSFET, has a gate connected to the Zener diode 1523, a drain that serves as output of the stage 1520, and a source connected to phase one select line 1508. The transistor 1525 serves to isolate the capacitor 1524 during read operations. Preferably, the capacitor 1524 is the gate capacitance of the transistor 1525. The input 1501 of the stage 1520 is applied to the diode-capacitor circuit through a diode 1522, which blocks conductance into the capacitance 1524 from the input 1501. A precharge voltage is applied to the capacitor 1524 through a diode 1521. Preferably, the stages 1530, 1560 and 1570 are identical to the stage 1520. Note that the Zener diode 1523 could be eliminated in reliance on the diode 1522, provided the input voltage were shifted to compensate. In other words, the Zener diode 1523 acts like a battery.

Figure 17:
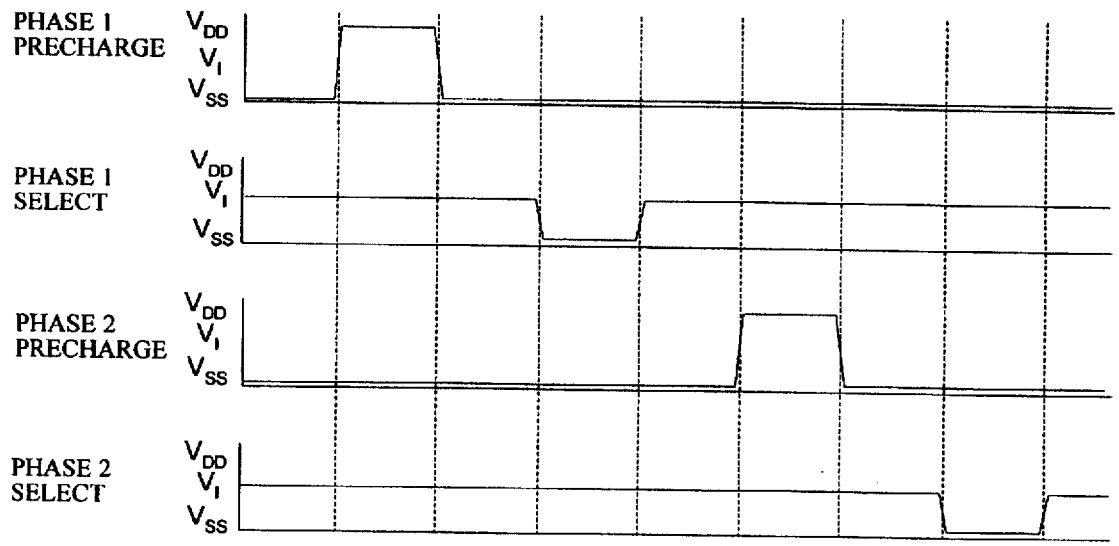
FIG. 17 is a graph showing certain voltages that may be applied to operate the dynamic register of FIG. 16.

The dynamic register 1500 also includes a phase one precharge line 1504, a phase one select line 1506, a phase two precharge line 1502, and a phase two select line 1508. FIG. 17 is a timing diagram showing the sequence of assertions of precharge lines 1502 and 1504 and select lines 1506 and 1508. First, the phase one precharge line 1504 is brought to $V_{DD}$, which precharges capacitors 1524 and 1564 through diodes 1521 and 1561 respectively. Next, the phase 1 select line 1506 is brought to $V_{SS}$, which permits transistor 1535 to turn on if its associated capacitance 1534 is charged and discharge the capacitor 1564, thereby transferring the complement of the logical value stored in the first dynamic register stage 1510 into the second dynamic register stage 1550. At the same time, if the input signal on the data input line 1501 is low, the capacitor 1524 is selectively discharged to transfer the data input value into the first dynamic register stage 1510. Next, the phase two precharge line 1502 is brought to $V_{DD}$, which precharges capacitors 1534 and 1574 through diodes 1531 and 1571 respectively. Next, the phase two line 1508 is brought to $V_{SS}$, which permits transistors 1525 and 1565 to turn on if their associated capacitance 1524 and 1564 are charged and discharge the capacitors 1534 and 1574, thereby transferring the complement of the logical value stored in the master stages 1520 and 1560 into the slave stages 1530 and 1570.

To better understand the operation of the dynamic register 1500 of FIG. 16, assume that the gate capacitance 1564 in the master stage 1560 is charged, and consider how this charge is transferred (inverted) to the gate capacitance 1574 in the slave stage 1570. A precharge voltage is applied to the capacitance 1574 of the slave stage 1570 by assertion of the phase two precharge line 1502, thereby precharging the capacitance 1574 to the logical high value of $V_{DD}-V_{TD}$, where $V_{TD}$ is the diode voltage drop threshold for the diode 1571 (the diodes 1521, 1531 and 1561 as well). The voltage seen at the drain of the corresponding transistor 1565 is $V_D = V_{DD}-V_{TD}-V_{BZ}$, where $V_{BZ}$ is the combined voltage drop of the reverse breakdown voltage of the Zener diode 1573 plus the forward turn-on voltage of the ordinary diode 1572. However, no conduction occurs through the transistor 1565 of the master stage 1560 during phase two precharge because the phase two select line is held at an idle voltage $V_I$, chosen so that $V_I = V_{DD}-V_{TD}-V_{BZ}$. Hence, no discharging of the capacitance 1574 in the slave stage 1570 can occur through the transistor 1565 of the master stage 1560 until the select line 1508 is asserted by lowering it to $V_{SS}$. When the phase two select line 1508 is lowered to $V_{SS}$, if the transistor 1565 of the master stage 1560 is on (logical high), the capacitance 1574 of the slave stage 1570 discharges through the master stage 1560 to $V_{SS}+V_{BZ}$, which is the logical low value. This logical low value is held in the capacitance 1574 because the transistor 1575 is off, its source voltage being at $V_I$ since the phase one select line 1506 is not asserted.

The threshold voltage $V_T$ of the transistor 1575 (and the transistors 1525, 1535 and 1565) is determined as follows. When the capacitor 1574 is charged to a high value, the gate-to-source voltage of the transistor 1575 is $V_{GS}=V_{DD}-V_{TD}-V_{DD}+V_{TD}+V_{BZ}=V_{BZ}$. When the capacitor 1574 is charged to a low value, the gate-to-source voltage of the transistor 1575 is $V_{GS}=V_{SS}+V_{BZ}-V_{DD}+V_{TD}+V_{BZ}=V_{SS}+2V_{BZ}-V_{DD}+V_{TD}$. Thus the threshold voltage $V_T$ of the transistor 1575 (and of the transistors 1525, 1535 and 1565) is such that $V_{BZ}>V_T>V_{SS}+2V_{BZ}-V_{DD}+V_{TD}$. It follows then that the select and precharge assertion voltages are chosen so that $V_{DD}-V_{TD}-V_{SS}>V_{BZ}$. If, for instance, the values are chosen so that $V_{DD}-V_{TD}-V_{SS}=2V_{BZ}$, then the logical low value would correspond to $V_{GS}=0$ volts, while the logical high value would correspond to $V_{GS}=V_{BZ}$. Thus the threshold voltage of the transistor 1575 is chosen so that $V_{BZ}>V_T>0$ volts. Any values which meet these conditions will allow the circuit to operate correctly.

Note that since the gate capacitances 1524, 1534, 1564 and 1574 are tied to the sources of the transistors 1525, 1535, 1565 and 1575, which are in turn tied to the select lines 1506 and 1508, their gate-to-source voltages remain fixed during assertions of the respective select lines, causing "bootstrapping" of the gate voltages. During lowering of a transistor's select line the logical value stored at its gate is held intact.

While the circuit of FIG. 16 is based on inverters, standard methods for building basic inverting logic functions are applicable to this type of circuit in the same manner as in other dynamic precharge logic.

Figure 18:
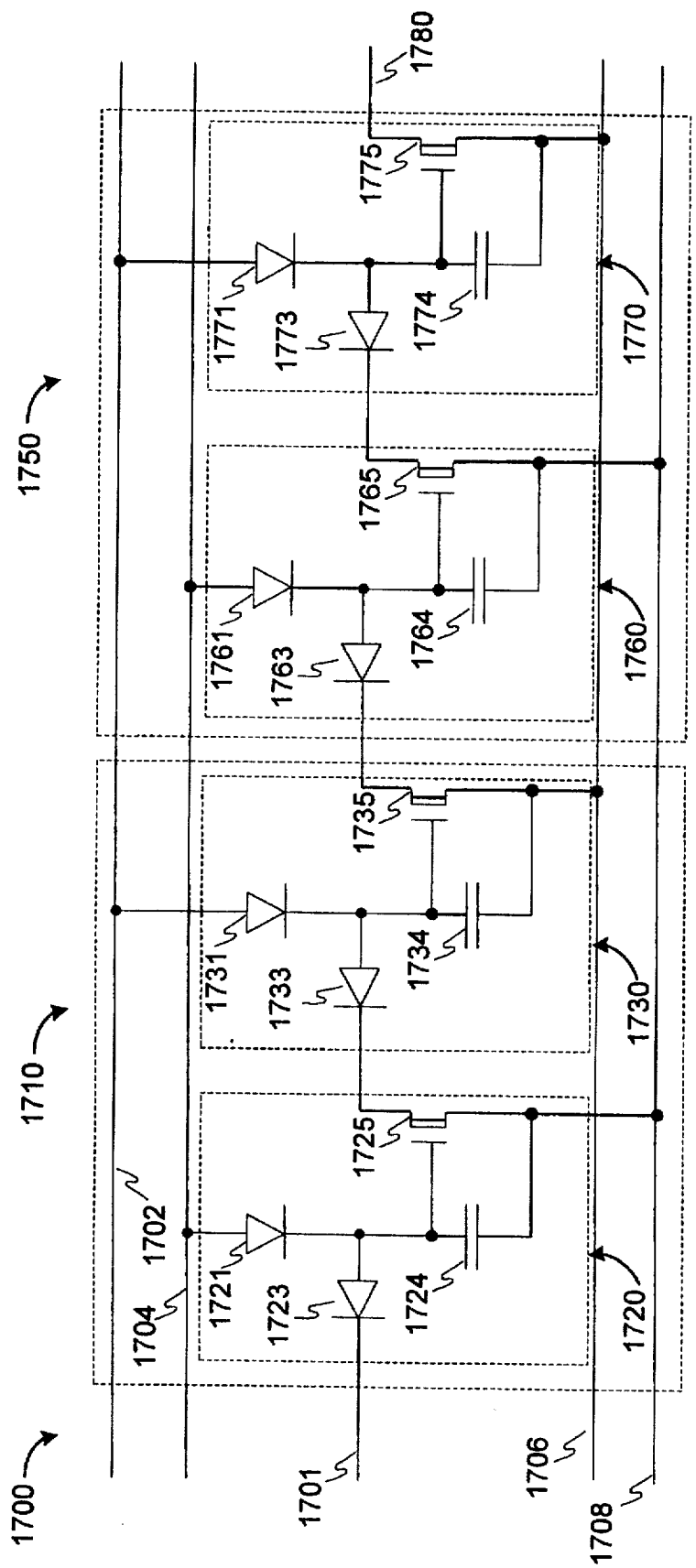
FIG. 18 is a schematic diagram showing another dynamic register based on the memory element used in the memory cell of FIG. 10.

FIG. 18 shows a dynamic clocked logic circuit 1700 which is similar to the circuit 1500 of FIG. 16 but uses ordinary diodes instead of reverse breakdown diodes. Stages 1710 and 1750 are dynamic register stages, each of which has two duplicate circuits in a master-slave configuration. For example, the dynamic register stage 1710 has a master stage 1720 and a slave stage 1730, and the dynamic register stage 1750 has a master stage 1760 and a slave stage 1770. The input of the master stage 1720 is data input line 1701, and the output of the slave stage 1770 is data output line 1780. The data is stored as charges on the capacitors 1724, 1734, 1764 and 1774, which preferably are the respective gate capacitances of transistors 1725, 1735, 1765 and 1775.

The stage 1720 includes diode 1723, which preferably is an ordinary diode, connected in series to a capacitor 1724, which is similar in principle to the capacitor 204. A transistor 1725, preferably an n-channel depletion mode MOSFET, has a gate connected to the diode 1723, a drain that serves as output of the stage 1720, and a source connected to phase one select line 1708. The transistor 1725 serves to isolate the capacitor 1724 during read operations. Preferably, the capacitor 1724 is the gate capacitance of the transistor 1725. The input 1701 of the stage 1720 is applied to the diode-capacitor circuit through the diode 1723, which also helps blocks conductance into the capacitance 1724 from the input 1701. A precharge voltage is applied to the capacitor 1724 through a diode 1721. Preferably, the stages 1730, 1760 and 1770 are identical to the stage 1720.

Figure 19:
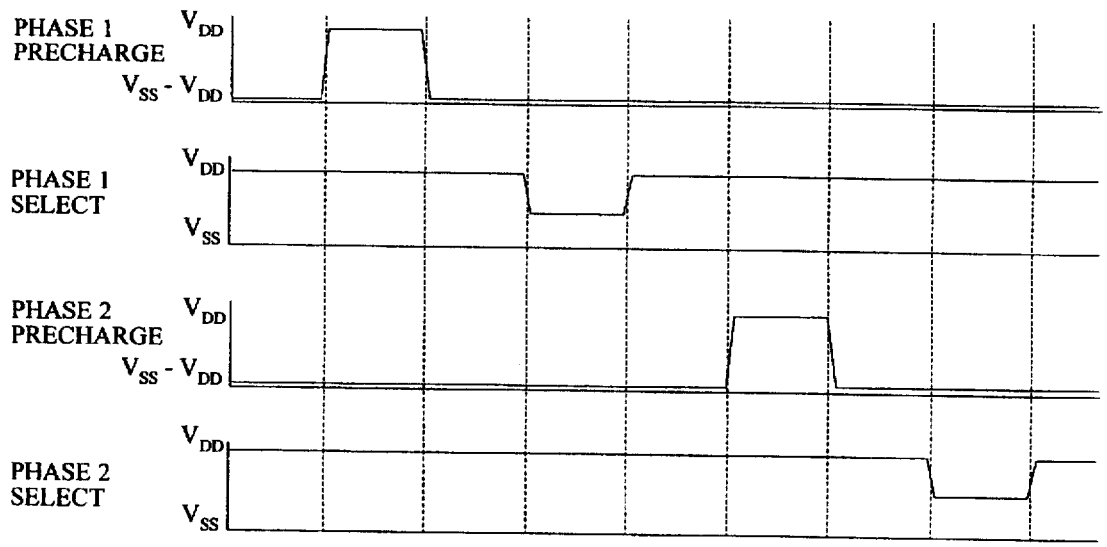
FIG. 19 is a graph showing certain voltages that may be applied to operate the dynamic register of FIG. 18.

The dynamic register 1700 includes a phase one precharge line 1704, a phase one select line 1706, a phase two precharge line 1702, and a phase two select line 1708. FIG. 19 is a timing diagram showing the sequence of assertions of precharge lines 1702 and 1704 and select lines 1706 and 1708. First, the phase one precharge line 1704 is brought to $V_{DD}$, which precharges capacitors 1724 and 1764 through diodes 1721 and 1761 respectively. Next, the phase one select line 1706 is brought to $V_{SS}$, which permits transistor 1735 to turn on if its associated capacitance 1734 is charged and discharge the capacitor 1764, thereby transferring the complement of the logical value stored in the first dynamic register stage 1710 into the second dynamic register stage 1750. At the same time, if the input signal on the data input line 1701 is low, capacitor 1724 is selectively discharged to transfer the data input value into the first dynamic register stage 1710. Next, the phase two precharge line 1702 is brought to $V_{DD}$, which precharges capacitors 1734 and 1774 through diodes 1731 and 1771 respectively. Next, the phase two select line 1708 is brought to $V_{SS}$, which permits transistors 1725 and 1765 to turn on if their associated capacitance 1724 and 1764 are charged and discharge the capacitors 1734 and 1774, thereby transferring the complement of the logical value stored in the master stages 1720 and 1760 into the slave stages 1730 and 1770.

While the dynamic register 1700 is similar to the dynamic register 1500, the diodes 1723, 1733, 1763 and 1773 have a smaller voltage drop when ON instead of the relatively larger reverse breakdown drop across the Zener diodes 1523, 1533, 1563 and 1573. For the circuit to operate properly, the transistors 1725, 1735, 1765 and 1775 are depletion mode devices with significant negative threshold voltages $V_T << -V_{TD}$, where $V_{TD}$ is the diode voltage drop for the diodes 1723, 1733, 1763 and 1773 as well as the diodes 1721, 1731, 1761 and 1771. Hence, suitable voltage levels for controlling the dynamic register 1700 are $V_{DD}$, $V_{SS}$ and $2V_{SS}-V_{DD}$.

Consider in more detail the operation of the dynamic register 1700 of FIG. 18 during the phase two precharge and select, when data is transferred from master to slave. During phase two precharge, the phase two precharge line 1702 is raised to $V_{DD}$ while the phase one precharge line 1704 is held low at $2V_{SS}-V_{DD}$ and the select lines 1706 and 1708 are held at $V_{DD}$. The transistors 1725, 1735, 1765 and 1775 have source voltages of $V_{DD}$ and maximum possible drain voltages of $V_{DD}-2V_{TD}$, so that these transistors do not conduct. Note that the presence of diodes 1723, 1733, 1763 and 1773 prevent conduction from the source to the gate capacitances 1724, 1734, 1764 and 1774. The voltages on the capacitances 1734 and 1774 in the slave stages 1730 and 1770 become equal to $-V_{TD}$.

Next, the phase two precharge line 1702 is restored to the voltage $2V_{SS}-V_{DD}$ and the phase two select line 1708 is asserted by lowering it to $V_{SS}$ so that the source voltages of transistors 1725 and 1765 in the master stages 1720 and 1760 go down to $V_{SS}$. If the corresponding capacitances 1724 and 1764 have gate-to-source voltage $V_{GS}=-V_{TD}$, illustratively corresponding to a logical high value, then the capacitances 1734 and 1774 discharge through the transistors 1725 and 1765 until the gate voltages of the transistors 1735 and 1775 in the slave stages 1730 and 1770 reach $V_{SS}+V_{TD}$. Note that the gate-to-source voltages $V_{GS}=-V_{TD}$ of the corresponding capacitances 1724 and 1764 of the master stages 1720 and 1760 are retained during assertion of the phase two select line 1708 due to charge bootstrapping. Since the slave stages 1730 and 1770 are not selected, the source voltage of the transistors 1735 and 1775 is $V_{DD}$ so that their gate-to-source voltages are $V_{GS}=V_{SS}+V_{TD}-V_{DD}$. This negative voltage $V_{GS}$ is chosen to be low enough to cause the transistors 1735 and 1775 to turn OFF, i.e. $V_T > V_{SS}+V_{TD}-V_{DD}$, thereby indicating a logical low value. On the other hand, if the corresponding capacitances 1724 and 1764 of the master stages 1720 and 1760 have the gate-to-source voltage $V_{GS}=V_{SS}+V_{TD}-V_{DD}<V_T$, illustratively corresponding to a logical low value, then the transistors 1735 and 1775 in the slave stages 1730 and 1770 do not conduct and their corresponding capacitors 1734 and 1774 remain charged at $V_{DD}-V_{TD}$. Note that the gate-to-source voltages are retained during assertion of the select line 1708 due to charge bootstrapping of the capacitances 1724 and 1764.

Note that the bootstrapping during select is why the precharge lines are set preferably to $2V_{SS}-V_{DD}$, and no greater than $2V_{SS}+2V_{TD}-V_{DD}$, when not being asserted.

Although the dynamic registers 1500 and 1700 are designed with MOSFET transistors whose gate capacitances serve as stored charge elements, other types of transistors may be used if desired. For example, where fast speed is critical, bipolar transistors may be used instead of MOSFET transistors. In arrangements using bipolar transistors, the stored charge elements are achieved using separate capacitors and base blocking diodes are used to prevent undesired base current flow. In an arrangement using PNP transistors (not shown), the emitters of the transistors are connected to ground while one terminal of each of the capacitors is connected to an appropriate select line. In another arrangement using PNP transistors (not shown), the emitters of the transistors are connected to appropriate select lines while one terminal of each of the capacitors is grounded.

Examples

The dynamic register 1500 of FIG. 16 was simulated using the P-SPICE circuit simulation package. The model was run for 800 ns in 0.01 ns intervals. The voltage on the data input line 1501 was specified as PWL (0 ns 5 24 ns 5 26 ns 0 84 ns 0 86 ns 5 104 ns 5 106 ns 5). The voltage on the phase one precharge line 1504 was specified as PULSE (0 5 10 ns 2 ns 2 ns 8 ns 200 ns), the voltage on the phase one select line 1506 was specified as PULSE (2.5 0 30 ns 2 ns 2 ns 8 ns 200 ns), the voltage on the phase two precharge line 1502 was specified as PULSE (0 5 105 ns 2 ns 2 ns 8 ns 200 ns), and the voltage on the phase two select line 1508 was specified as PULSE (2.5 0 125 ns 2 ns 2 ns 8 ns 200 ns). The initial voltages on the gates of the transistors 1525, 1535, 1565 and 1575 was specified at 4.5 volts. The capacitances 1524, 1534, 1564 and 1574 were specified as 50 ff; the diodes 1521, 1531, 1561 and 1571 were specified as standard diodes; the diodes 1522, 1532, 1562 and 1572 were specified as standard diodes; the Zener diodes 1523, 1533, 1563 and 1573 were specified as standard Zener diodes with a reverse breakdown voltage of 1.7 volts; the contact points between the diodes 1522 and 1523, 1532 and 1533, 1562 and 1563, and 1572 and 1573 were specified as having a capacitance of 5 ff (the simulator required that a capacitance be specified for this node); and the transistors 1525, 1535, 1565 and 1575 were specified as enhancement mode NMOS transistors having a length of 2 um, a width of 6 um, a gamma of 0.37, and a VTO of 0.7 volts. Since the simulator did not permit floating an output node, a fifth stage (not shown) was added that was identical to the stages 1520, 1530, 1560 and 1570 except lacking the NMOS transistor (but including the gate capacitance).

Figure 20:
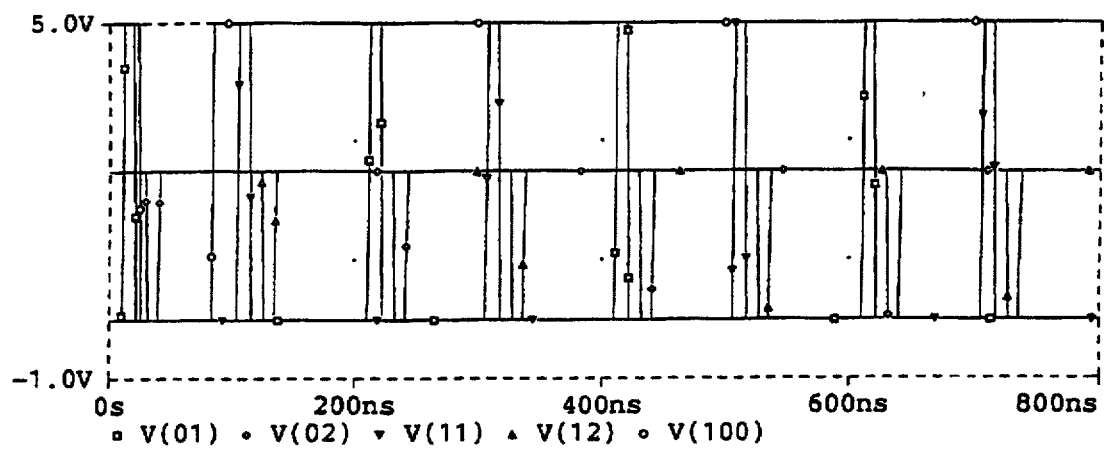
FIGS. 20–25 are graphs showing the results of a simulation of the dynamic register of FIG. 16.
Figure 21:
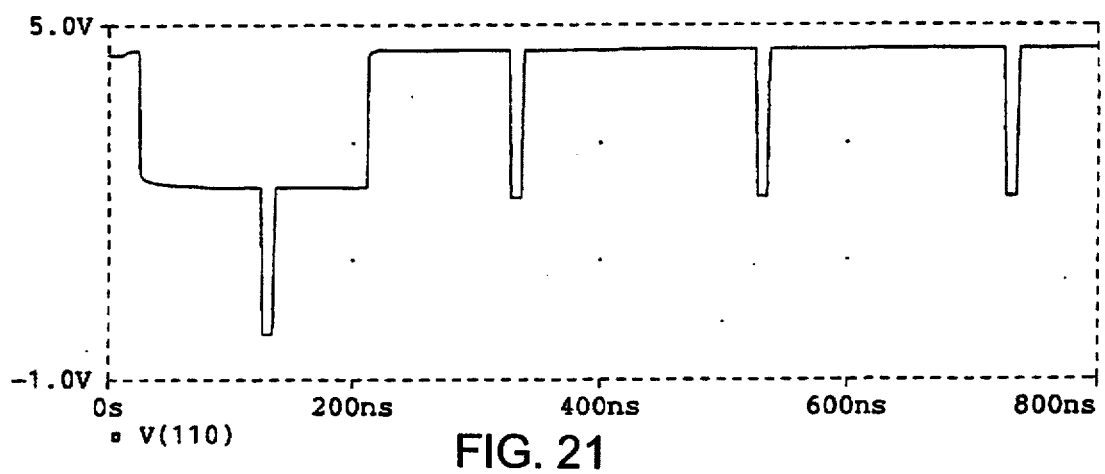
Figure 22:
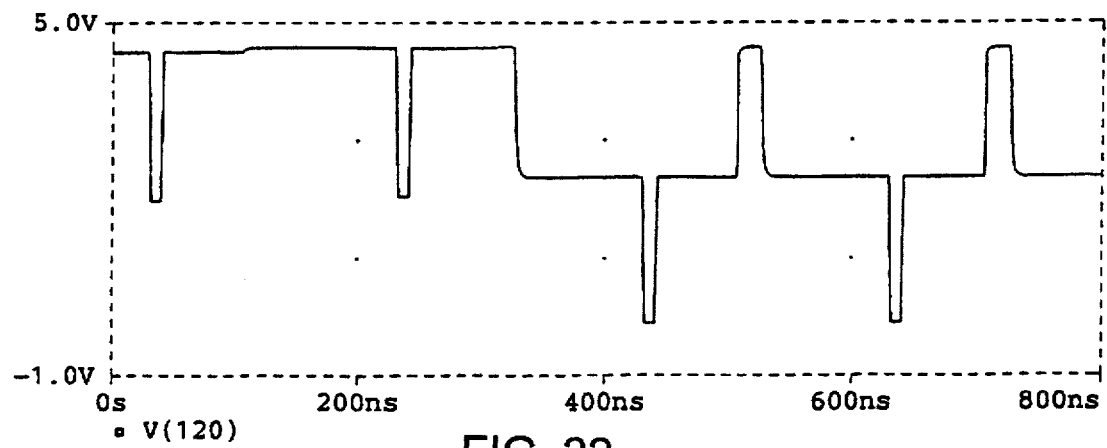
Figure 23:
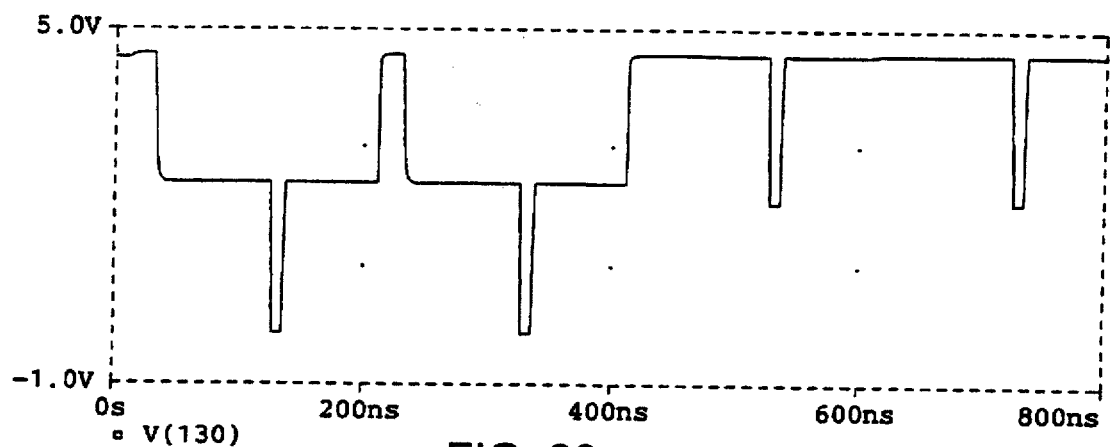
Figure 24:
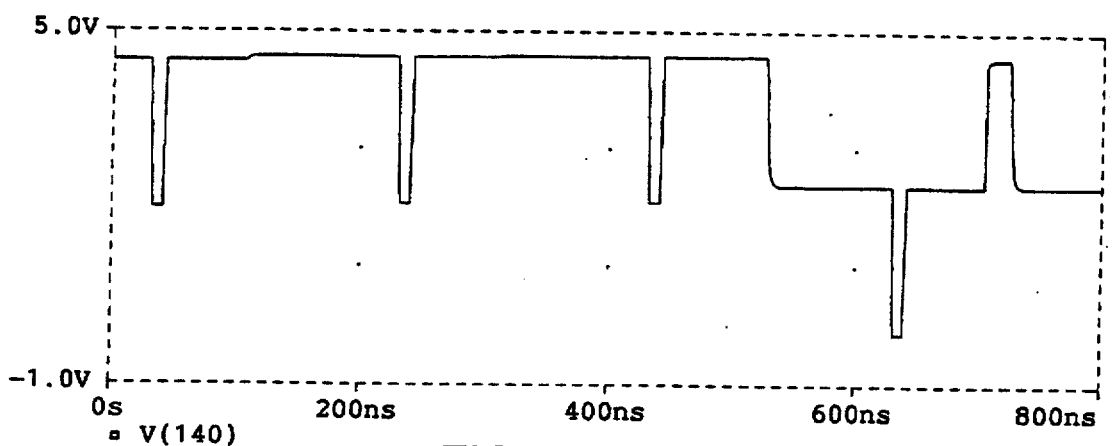
Figure 25:
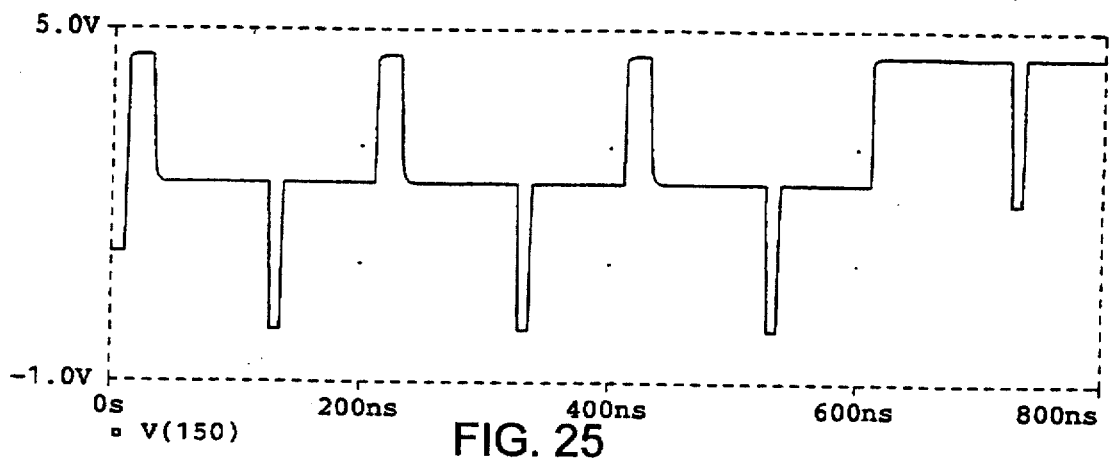

FIGS. 20 through 25 show the results of the SPICE simulation of the dynamic register 1500. FIG. 20 shows the voltages on the phase one precharge line 1504 (symbol □), on the phase two precharge line 1502 (symbol ▽), on the phase one select line 1506 (symbol ◊), on the phase two select line 1508 (symbol △), and on the data input line 1501 (symbol o). FIGS. 21 through 25 show the voltages on the gate capacitances 1524, 1534, 1564 and 1574 of the transistors 1525, 1535, 1565 and 1575, and on the corresponding capacitance in the additional stage. The data input on line 1501 is initially low, which causes the gate voltage of transistor 1525 to also go low on the first precharge-select cycle. On the next precharge-select cycle, the data input on line 1501 goes high. The gate voltage of the first stage transistor 1525 also goes high, but the low-to-high transition on the gate of transistor 1525 is copied as a high-to-low transition on the gate of the second stage transistor 1535 on the next precharge-select cycle. Similarly, FIGS. 23 through 25 show how the transitions are copied, or inverted, to the succeeding stages. Finally, the transition appears at the output of the circuit as a low-to-high transition after two complete cycles between phase 1 and phase 2 precharge-select operations.

Note that for each of the gate capacitance voltages a brief negative voltage pulse occurs during the select portion of the opposite phase, in addition to the logical transitions between low and high and the precharge high. This negative voltage pulse occurs because of bootstrapping. This excursion is completely reversed at the end of the select line assertion so that the logical state on the line remains unaltered. The logical high voltage is 4.6 volts while the logical low voltage is 2.4 volts, except that during bootstrapping the logical high becomes 2.2 volts and the logical low becomes -0.2 volts.

The dynamic register 1700 of FIG. 18 was also simulated using the P-SPICE circuit simulation package. The model was run for 800 ns in 0.01 ns intervals. The voltage on the data input line 1701 was specified as PWL (0 ns 5 24 ns 5 26 ns 0 84 ns 0 86 ns 5 104 ns 5 106 ns 5). The voltage on the phase one precharge line 1704 was specified as PULSE (−5 5 10 ns 2 ns 8 ns 200 ns), the voltage on the phase one select line 1706 was specified as PULSE (5 0 30 ns 2 ns 2 ns 8 ns 200 ns), the voltage on the phase two precharge line 1702 was specified as PULSE (−5 5 105 ns 2 ns 2 ns 8 ns 200 ns), and the voltage on the phase two select line 1708 was specified as PULSE (5 0 125 ns 2 ns 2 ns 8 ns 200 ns). The initial voltages on the gates of the transistors 1725, 1735, 1765 and 1775 was specified at 4.5 volts. The capacitances 1724, 1734, 1764 and 1774 were specified as 50 ff; the diodes 1721, 1731, 1761 and 1771 were specified as standard diodes; the diodes 1723, 1733, 1763 and 1773 were specified as standard diodes; and the transistors 1725, 1735, 1765 and 1775 were specified as depletion mode NMOS transistors having a length of 2 um, a width of 3 um, a gamma of 0.37, and a VTO of 1.5 volts. Since the simulator did not permit floating output nodes, a fifth stage (not shown) was added that was identical to the stages 1720, 1730, 1760 and 1770 except lacking the NMOS transistor (but including the gate capacitance).

Figure 26:
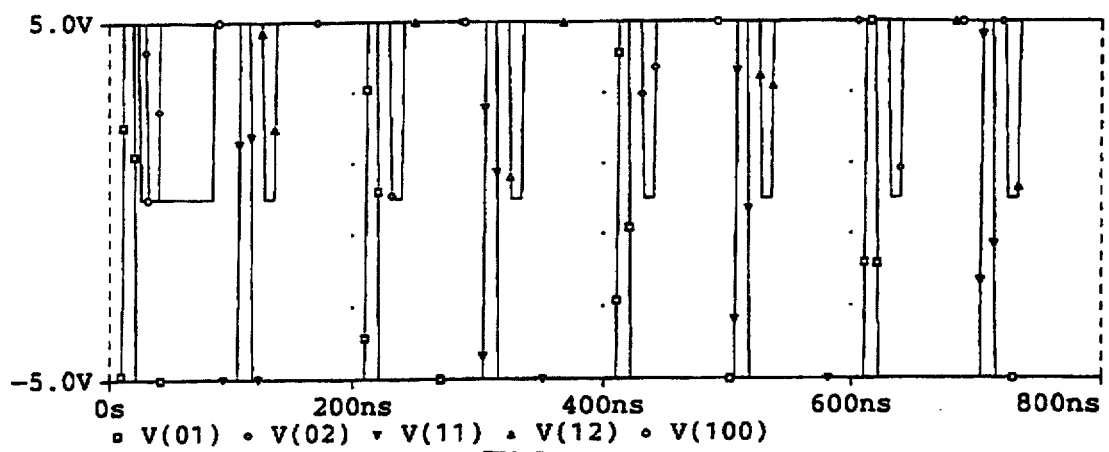
FIGS. 26–31 are graphs showing the results of a simulation of the dynamic register of FIG. 18.
Figure 27:
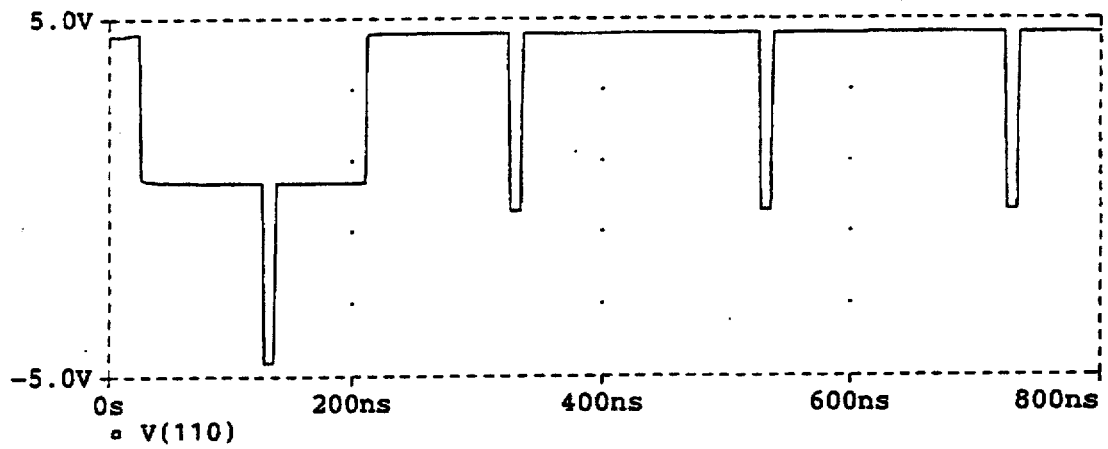
Figure 28:
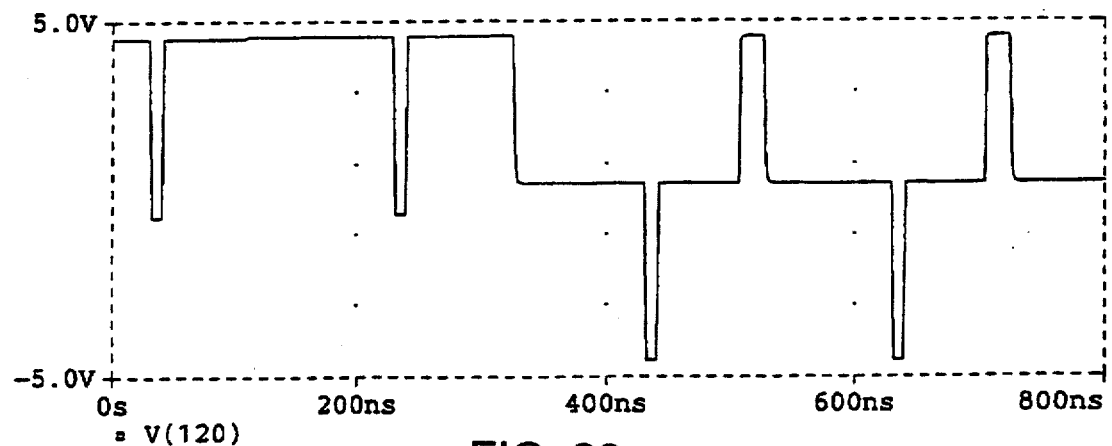
Figure 29:
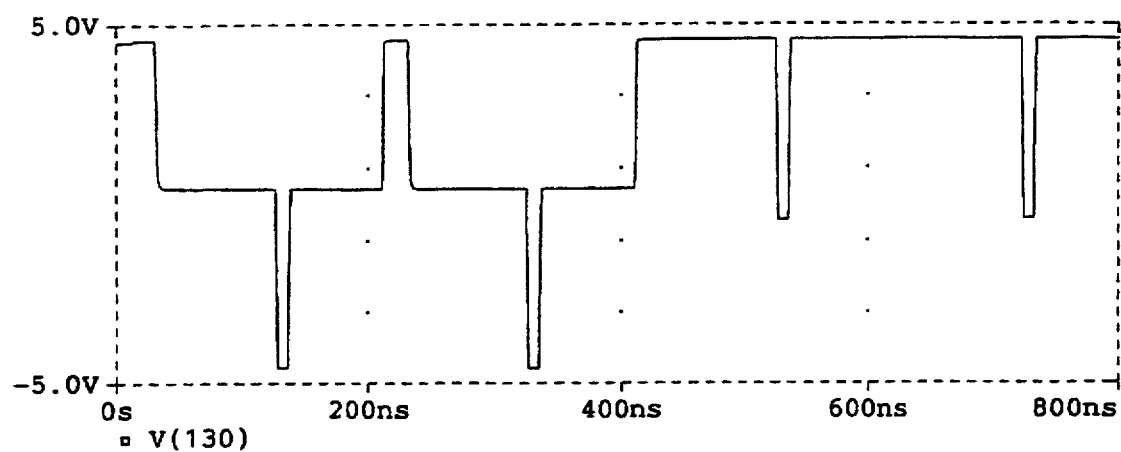
Figure 30:
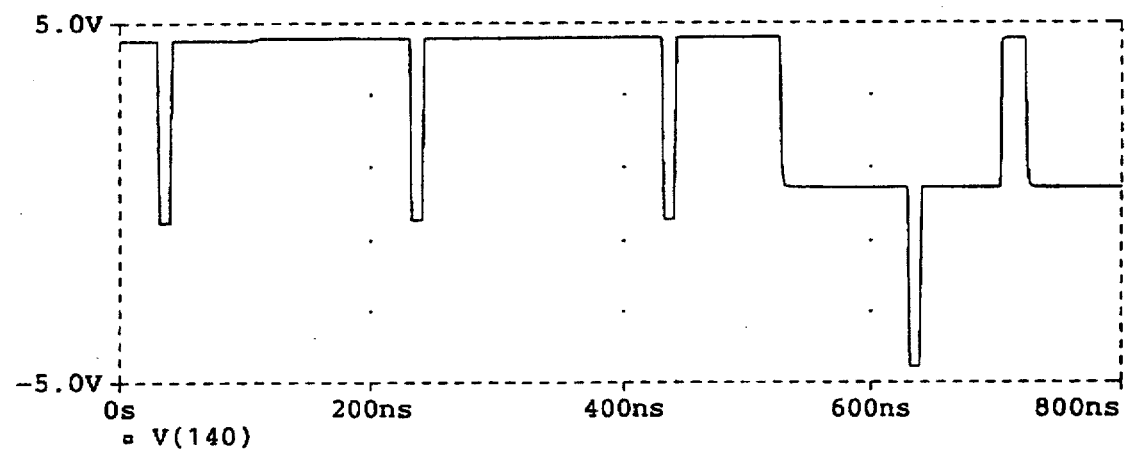
Figure 31:
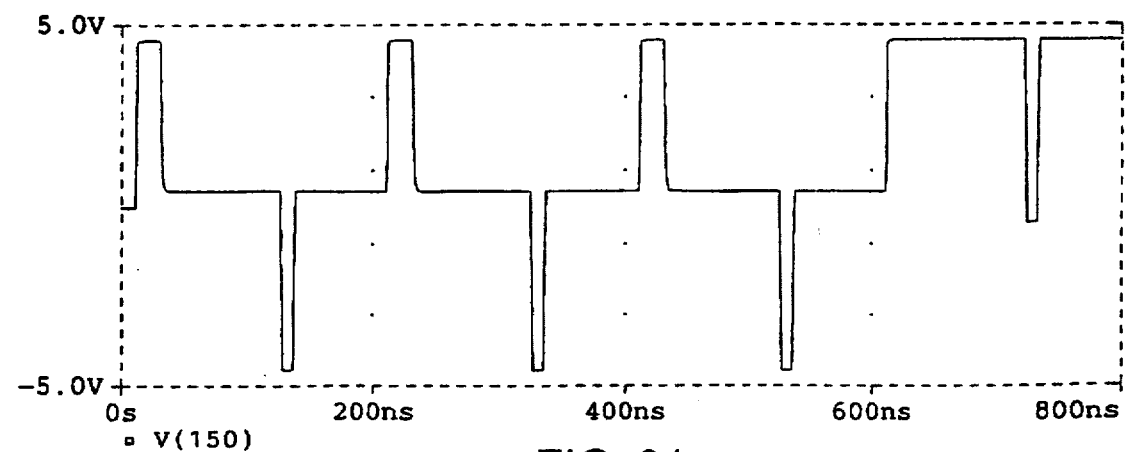

FIGS. 26 through 31 show the results of the SPICE simulation of the dynamic register 1700. FIG. 26 shows the voltages on the phase one precharge line 1704 (symbol □), on the phase two precharge line 1702 (symbol ▽), on the phase one select line 1706 (symbol ◇), on the phase two select line 1708 (symbol △), and on the data input line 1701 (symbol o). FIGS. 21 through 25 show the voltages on the gate capacitances 1724, 1734, 1764 and 1774 of the transistors 1725, 1735, 1765 and 1775, and on the corresponding capacitance in the additional stage. The data input on line 1701 is initially low, which causes the gate voltage of transistor 1725 to also go low on the first precharge-select cycle. On the next precharge-select cycle, the data input on line 1701 goes high. The gate voltage of the first stage transistor 1725 also goes high, but the low-to-high transition on the gate of transistor 1725 is copied as a high-to-low transition on the gate of the second stage transistor 1735 on the next precharge-select cycle. Similarly, FIGS. 23 through 25 show how the transitions are copied, or inverted, to the succeeding stages. Finally, the transition appears at the output of the circuit as a low-to-high transition after two complete cycles between phase 1 and phase 2 precharge-select operations.

Note that for each of the gate capacitance voltages a brief negative voltage pulse occurs during the select portion of the opposite phase, in addition to the logical transitions between low and high and the precharge high. This negative voltage pulse occurs because of bootstrapping. This excursion is completely reversed at the end of the select line assertion so that the logical state on the line remains unaltered. The logical high voltage is 4.6 volts while the logical low voltage is 0.3 volts, except that during bootstrapping the logical high becomes −0.3 volts and the logical low becomes −4.6 volts.

The description of the invention set forth herein is illustrative, and does not limit the scope of the invention as set forth in the following claims. Variations and modifications of the embodiments disclosed herein are possible. For example, the capacitor and Zener diode of one of the embodiments are illustrative, and other devices having similar characteristics may be substituted. Also, the MOSFET transistors used in various embodiments are illustrative since they are merely specific types of amplifying valves, and other devices having the characteristics of an amplifying valve may be substituted. For example, vacuum tube triodes and semiconductor transistors of all kinds are examples of amplifying valves that may be suitable for use in modifications of some of the embodiments described herein. Moreover, the formulaic relationship of the voltages in the ideal case and the values of the voltages applied to the DRAM in its various modes of operation of the Example are illustrative, and not only may different voltage levels having the same relationships be used, but the relationships themselves are not critical. For example, where a negative voltage supply is not available, the voltages are scaleable so that positive voltages only can be used. As a further example, the relationships set forth establish ideally large and uniform buffer voltages between $V_c$ and $V_{rs1}$ and $V_{cb1}$, but other voltages that do not preserve such a buffer are contemplated as well. In another variation, the voltages may be applied with a different timing than set forth in the Example. Moreover, the designation of select line and bit line are arbitrary at the cell level, and the designations can be switched if desired. These and other variations and modifications of the embodiments disclosed herein may be made without departing from the scope and spirit of the invention the scope as set forth in the following claims.

What is claimed is:

1. A memory comprising:
   a first stored charge element having first and second terminals;
   a first memory access node coupled to the first terminal of the first stored charge element;
   a first charge input path having a second memory access node, the first charge input path being a charge path into the second terminal of the first stored charge element and having a substantially definite voltage drop threshold from the second memory access node to the second terminal of the first stored charge element above which conduction occurs with no significant deterioration over time and below which significant conduction does not occur; and
   a first charge output path having a third memory access node, the first charge output path being a charge path from the second terminal of the first stored charge element and having a substantially definite voltage drop threshold from the second terminal of the first stored charge element to the third memory access node above which conduction occurs with no significant deterioration over time and below which significant conduction does not occur, the respective voltage drop thresholds of the first charge input path and the first charge output path being unequal;
   wherein at least one of the first, second and third memory access nodes is a bit node.

2. A memory as in claim 1 wherein the stored charge element is a discrete integrated circuit capacitor.

3. A memory as in claim 1 wherein the stored charge element is gate capacitance of a MOSFET.

4. A memory as in claim 1 wherein the first charge input path and the first charge output path are opposite directions through a bi-directional voltage dropping element.

5. A memory as in claim 4 wherein:
   the bi-directional voltage dropping element is a bi-directional voltage dropping device; and
   the bi-directional voltage dropping device has a first terminal coupled to the second terminal of the stored charge element and a second terminal that includes the second and third memory access nodes.

6. A memory as in claim 5 wherein the bi-directional voltage dropping device is a Zener diode having a forward direction and a reverse direction corresponding to the opposite directions through the bi-directional voltage dropping device.

7. A memory as in claim 4 wherein:
the first charge input path through the bi-directional voltage dropping element is a first voltage dropping device having one terminal coupled to the second terminal of the first stored charge element and a second terminal that is the second memory access node; and
the first charge output path through the bi-directional voltage dropping element is a second voltage dropping device having one terminal coupled to the second terminal of the first stored charge element and a second terminal that is the third memory access node.

8. A memory as in claim 7 wherein the first and second voltage dropping devices are respective diodes and the substantially definite voltage drop thresholds are voltage drop thresholds in forward directions through the diodes.

9. A memory as in claim 1 wherein:
the first stored charge element, the first charge input path, and the first charge output path form in combination a first dynamic memory cell; and
the second and third memory access nodes are in unity as a terminal of the first dynamic memory cell.

10. A memory as in claim 9 further comprising a second dynamic memory cell having:
a second stored charge element having first and second terminals;
a fourth memory access node coupled to the first terminal of the second stored charge element;
a second charge input path having a fifth memory access node, the second charge input path being a charge path into the second terminal of the second stored charge element and having a substantially definite voltage drop threshold from the fifth memory access node to the second terminal of the second stored charge element above which conduction occurs with no significant deterioration over time and below which significant conduction does not occur; and
a second charge output path that includes the fifth memory access node, the second charge output path being a charge path from the second terminal of the second stored charge element and having a substantially definite voltage drop threshold from the second terminal of the second stored charge element to the fifth memory access node above which conduction occurs with no significant deterioration over time and below which significant conduction does not occur, the respective voltage drop thresholds of the second charge input path and the second charge output path being unequal;
wherein at least one of the fourth and fifth memory access nodes is a bit node, and wherein the first, second, fourth and fifth nodes are interconnected in any manner provided the first and second memory access nodes are not interconnected, and further provided the fourth and fifth memory access nodes are not interconnected.

11. A memory as in claim 10 wherein the first and fourth memory access nodes are respectively portions of a word select line, and the second and fifth memory access nodes are respective portions of different column bit lines.

12. A memory as in claim 10 wherein the first and fourth memory access nodes are respectively portions of different word select lines, and the second and fifth memory access nodes are respective portions of a column bit line.

13. A memory as in claim 1 wherein:
the first stored charge element, the first charge input path, and the first charge output path form in combination a first dynamic memory cell; and
the second and third memory access nodes are separate terminals of the first dynamic memory cell.

14. A memory as in claim 13 further comprising a second dynamic memory cell having:
a second stored charge element having first and second terminals;
a fourth memory access node coupled to the first terminal of the second stored charge element;
a second charge input path having a fifth memory access node, the second charge input path being a charge path into the second terminal of the second stored charge element and having a substantially definite voltage drop threshold from the fifth memory access node to the second terminal of the second stored charge element above which conduction occurs with no significant deterioration over time and below which significant conduction does not occur; and
a second charge output path having a sixth memory access node, the second charge output path being a charge path from the second terminal of the second stored charge element and having a substantially definite voltage drop threshold from the second terminal of the second stored charge element to the sixth memory access node above which conduction occurs with no significant deterioration over time and below which significant conduction does not occur, the respective voltage drop thresholds of the second charge input path and the second charge output path being unequal;
wherein at least one of the fourth, fifth and sixth memory access nodes is a bit node, and wherein the first, second, third, fourth, fifth and sixth memory access nodes are interconnected in any manner provided the first memory access node is not interconnected with either of the second and third memory access nodes, and further provided the fourth memory access node is not interconnected with either of the fifth and sixth memory access nodes.

15. A memory as in claim 14 wherein the first and fourth memory access nodes are respectively portions of a word select line, the second and fifth memory access nodes are respective portions of different charge column bit lines, and the third and sixth memory access nodes are respective portions of different discharge column bit lines.

16. A memory as in claim 15 wherein the charge column bit lines are bit read lines and the discharge column bit lines are bit write lines.

17. A memory as in claim 14 wherein the first and fourth memory access nodes are respectively portions of different word select lines, the second and fifth memory access nodes are respective portions of a charge column bit line, and the third and sixth memory access nodes are respective portions of a discharge column bit line.

18. A memory element as in claim 17 wherein the charge column bit line is a bit read line and the discharge column bit line is a bit write line.

19. A memory as in claim 1 wherein a voltage $V_H$ across the stored charge element is indicative of a first logical state, a voltage $V_L$ across the stored charge element is indicative of a second logical state, the substantially definite voltage drop threshold of the first charge input path is represented by $V_I$, and the substantially definite voltage drop threshold of the first charge output path is represented by $V_O$, further comprising:
means for establishing a voltage $V_{1C}$ on the first memory access node and a voltage $V_{2C}$ on the second memory access node, the voltages $V_{1C}$ and $V_{2C}$ being related approximately in accordance with the expression $V_{2C} + V_H \geq V_I + V_{1C}$;

means for establishing a voltage $V_{1D}$ on the first memory access node and a voltage $V_{3D}$ on the third memory access node, the voltages $V_{1D}$ and $V_{3D}$ being related approximately in accordance with the expression $V_{1D} \geq V_L + V_O + V_{3D}$; and means for sensing perturbation in voltage on the second memory access node.

20. A memory as in claim 19 further comprising:

means for establishing an idle voltage $V_{1X}$ on the first memory access node, the voltages $V_{1X}$ and $V_{2C}$ being related approximately in accordance with the expression $V_{2C} + V_L \leq V_f + V_{1X}$, and the voltages $V_{1X}$ and $V_{3D}$ being related approximately in accordance with the expression $V_{1X} \leq V_H + V_O + V_{3D}$;

means for establishing an idle voltage $V_{2X}$ on the second memory access node, the voltages $V_{1C}$ and $V_{2X}$ being related approximately in accordance with the expression $V_{2X} + V_L \leq V_f + V_{1C}$, and the voltages $V_{1D}$ and $V_{2X}$ being related approximately in accordance with the expression $V_{2X} + V_L \leq V_f + V_{1D}$; and means for establishing an idle voltage $V_{3X}$ on the third memory access node, the voltages $V_{1C}$ and $V_{3X}$ being related approximately in accordance with the expression $V_{1C} \leq V_H + V_O + V_{3X}$, and the voltages $V_{1D}$ and $V_{3X}$ being related approximately in accordance with the expression $V_{1D} \leq V_H + V_O + V_{3X}$.

21. A memory as in claim 20 wherein $V_H$ exceeds $V_L$ by not more than about half of $V_f + V_O$.

22. A memory comprising:

a stored charge element having first and second terminals;

a first memory access node coupled to the first terminal of the first stored charge element;

a charge input path having a second memory access node, the charge input path being a charge path into the second terminal of the first stored charge element and having a substantially definite voltage drop threshold from the second memory access node to the second terminal of the first stored charge element above which conduction occurs with no significant deterioration over time and below which significant conduction does not occur;

a charge output path having a third memory access node, the charge output path being a charge path from the second terminal of the first stored charge element and having a substantially definite voltage drop threshold from the second terminal of the first stored charge element to the third memory access node above which conduction occurs with no significant deterioration over time and below which significant conduction does not occur; and an amplifying valve having a control terminal coupled to the second terminal of the first stored charge element, a first current terminal coupled to the first access node, and a second current terminal coupled to a memory read node;

wherein at least one of the first, second and third memory access nodes is a bit node.

23. A memory comprising:

a first stored charge element having first and second terminals;

a first memory access node coupled to the first terminal of the first stored charge element;

a first charge input path having a second memory access node, the first charge input path being a charge path into the second terminal of the first stored charge element and having a substantially definite voltage drop threshold from the second memory access node to the second terminal of the first stored charge element above which conduction occurs and below which significant conduction does not occur; and a first charge output path having a third memory access node, the first charge output path being a charge path from the second terminal of the first stored charge element and having a substantially definite voltage drop threshold from the second terminal of the first stored charge element to the third memory access node above which conduction occurs and below which significant conduction does not occur;

wherein the first stored charge element, the first charge input path, and the first charge output path form in combination a first dynamic memory cell, the memory further comprising a word select line, first, second and third column bit lines, and a second dynamic memory cell having:

a second stored charge element having first and second terminals;

a fourth memory access node coupled to the first terminal of the second stored charge element;

a second charge input path having a fifth memory access node, the second charge input path being a charge path into the second terminal of the second stored charge element and having a substantially definite voltage drop threshold from the fifth memory access node to the second terminal of the second stored charge element above which conduction occurs and below which significant conduction does not occur; and a second charge output path having a sixth memory access node, the second charge output path being a charge path from the second terminal of the second stored charge element and having a substantially definite voltage drop threshold from the second terminal of the second stored charge element to the sixth memory access node above which conduction occurs and below which significant conduction does not occur;

wherein the first and fourth memory access nodes are coupled to the word select line, the second and sixth memory access nodes are coupled to the second column bit line, the third memory access node is coupled to the first column bit line, and the fifth memory access node is coupled to the third column bit line.

24. A memory as in claim 23 wherein a voltage $V_H$ across the first and second stored charge elements is indicative of a first logical state and a voltage $V_L$ across the first and second stored charge elements is indicative of a second logical state, further comprising:

means for maintaining the second column bit line nominally offset from the first column bit by $V_H - V_L$; and means for maintaining the third column bit line nominally offset from the second column bit by $V_H - V_L$.

25. A memory comprising:

a stored charge element having first and second terminals;

a first memory access node coupled to the first terminal of the first stored charge element;

a charge input path having a second memory access node, the first charge input path being a charge path into the second terminal of the first stored charge element and having a substantially definite voltage drop threshold from the second memory access node to the second terminal of the first stored charge element above which conduction occurs and below which significant conduction does not occur;

a charge output path having a third memory access node, the first charge output path being a charge path from the second terminal of the first stored charge element and having a substantially definite voltage drop threshold from the second terminal of the first stored charge element to the third memory access node above which conduction occurs and below which significant conduction does not occur; and a latch having an input/output terminal coupled to the second terminal of the stored charge element;

wherein at least one of the first, second and third memory access nodes is a bit node, and the charge input path and the charge output path are opposite directions through a bi-directional voltage dropping element having a first terminal coupled to the second terminal of the stored charge device and a second terminal that includes the second and third memory access nodes.

26. A memory as in claim 25 wherein the latch has a capacitance present at the input/output terminal thereof, the stored charge element being the capacitance of the input/output terminal of the latch.

27. A memory as in claim 26 wherein the latch comprises:

a first inverter having a true input, a complement input, and an output; and a second inverter having a true input, a complement input, and an output, the output of the first inverter being coupled to the true and complement inputs of the second inverter, and the output of the second inverter being coupled to the true and complement inputs of the first inverter;

wherein the output of the first inverter is the input/output terminal of the latch.

28. A memory comprising:

a first stored charge element having first and second terminals;

a first memory access node coupled to the first terminal of the first stored charge element;

a first charge input path having a second memory access node, the first charge input path being a charge path into the second terminal of the first stored charge element and having a substantially definite voltage drop threshold from the second memory access node to the second terminal of the first stored charge element above which conduction occurs and below which significant conduction does not occur;

a first charge output path having a third memory access node, the first charge output path being a charge path from the second terminal of the first stored charge element and having a substantially definite voltage drop threshold from the second terminal of the first stored charge element to the third memory access node above which conduction occurs and below which significant conduction does not occur;

a second stored charge element having first and second terminals;

a fourth memory access node coupled to the first terminal of the second stored charge element;

a second charge input path having a fifth memory access node, the second charge input path being a charge path into the second terminal of the second stored charge element and having a substantially definite voltage drop threshold from the fifth memory access node to the second terminal of the second stored charge element above which conduction occurs and below which significant conduction does not occur; and a second charge output path having a sixth memory access node, the second charge output path being a charge path from the second terminal of the second stored charge element and having a substantially definite voltage drop threshold from the second terminal of the second stored charge element to the sixth memory access node above which conduction occurs and below which significant conduction does not occur;

a first inverter having a true input, a complement input, and an output; and a second inverter having a true input, a complement input, and an output, the output of the first inverter being coupled to the true and complement inputs of the second inverter, and the output of the second inverter being coupled to the true and complement inputs of the first inverter;

wherein:

the output of the first inverter is further coupled to the second terminal of the first stored charge element, and the output of the second inverter is further coupled to the second terminal of the second stored charge element;

at least one of the first, second and third memory access nodes is a bit node;

at least one of the fourth, fifth and sixth memory access nodes is a bit node;

the first charge input path and the first charge output path are opposite directions through a first bi-directional voltage dropping element having a first terminal coupled to the second terminal of the first stored charge device and a second terminal that includes the second and third memory access nodes; and the second charge input path and the second charge output path are opposite directions through a second bi-directional voltage dropping element having a first terminal coupled to the second terminal of the second stored charge device and a second terminal that includes the fifth and sixth memory access nodes.

29. A memory comprising:

a stored charge element having first and second terminals;

a first memory access node coupled to the first terminal of the first stored charge element;

a charge input path having a second memory access node, the first charge input path being a charge path into the second terminal of the first stored charge element and having a substantially definite voltage drop threshold from the second memory access node to the second terminal of the first stored charge element above which conduction occurs and below which significant conduction does not occur;

a charge output path having a third memory access node, the first charge output path being a charge path from the second terminal of the first stored charge element and having a substantially definite voltage drop threshold from the second terminal of the first stored charge element to the third memory access node above which conduction occurs and below which significant conduction does not occur; and an amplifying valve having a control terminal coupled to the second terminal of the stored charge element, a first current terminal coupled to the first access node, and a second current terminal coupled to a stage output node;

wherein the second memory access node is coupled to a precharge line and the third memory access node is coupled to a stage input node.

30. A memory as in claim 29 wherein the amplifying valve is a MOSFET and the first charge storage element is gate capacitance of the MOSFET.

31. A memory as in claim 1 wherein the first stored charge element, the first charge input path, and the first charge output path form in combination a first memory cell, the first memory access node being a first terminal of the first memory cell and the second and third memory access nodes being in unity as a second terminal of the first memory cell, further comprising a plurality of N-1 additional memory cells, each having:

an additional stored charge element having first and second terminals;

an additional first memory access node coupled to the first terminal of the additional stored charge element, the additional first memory access node being a first terminal of the additional memory cell;

an additional charge input path having an additional second memory access node, the additional charge input path being a charge path into the second terminal of the additional stored charge element and having a substantially definite voltage drop threshold from the additional second memory access node to the second terminal of the additional stored charge element above which conduction occurs and below which significant conduction does not occur; and an additional charge output path having an additional third memory access node, the additional charge output path being a charge path from the second terminal of the additional stored charge element and having a substantially definite voltage drop threshold from the second terminal of the additional stored charge element to the additional third memory access node above which conduction occurs and below which significant conduction does not occur, the second and third additional memory access nodes being in unity as a second terminal of the additional memory cell;

wherein:

the N memory cells are linked in a closed loop chain such that neighboring memory cells are coupled to one another by one of the respective first and second terminals thereof, the substantially definite voltage drop thresholds of the charge input paths of the N memory cells are substantially equal to a value $V_I$;

the substantially definite voltage drop thresholds of the charge output paths of the N memory cells are substantially equal to a value $V_O$; and $V_I$ and $V_O$ are related to a high value of stored voltage $V_H$ of the memory cells and a low value of stored voltage $V_L$ of the memory cells by the expression $V_H-V_L \leq (V_I+V_O)(N-2)/N$.

32. A method of controlling voltage across a stored charge element included in a memory so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage, the respective voltage drop thresholds of the first and second current paths being unequal; and blocking current through the first and second current paths by use of the first and second substantially definite voltage drop thresholds during an interval following and contiguous with at least one of the first and second intervals.

33. A method as in claim 32 wherein the first and second current paths are in opposite directions through a common physical structure.

34. A method as in claim 33 wherein the first and second substantially definite voltage drop thresholds are obtained from a Zener diode.

35. A method as in claim 32 wherein the first and second current paths are through different structures that share a common node at a terminal of the stored charge element.

36. A method as in claim 35 wherein the first and second substantially definite voltage drop thresholds are obtained from respective diodes.

37. A method as in claim 32 wherein:

the first and second voltages are indicative of respective logical states; and the current blocking step comprises blocking current through the first and second current paths during respective intervals following and contiguous with the first and second intervals.

38. A method as in claim 37 wherein the first voltage is indicative of a logical one and the second voltage is indicative of a logical zero.

39. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage;

blocking current through the first and second current paths by use of the first and second substantially definite voltage drop thresholds during an interval following and contiguous with at least one of the first and second intervals;

attempting to flow current during a third interval through the first current path to increase voltage across the stored charge element to the first voltage; and sensing current flow during the third interval, a sensed first value of current flow indicating a particular one of the plurality of logical states and a sensed second value of current flow indicating another particular one of the plurality of logical states.

40. A method as in claim 39 wherein the sensed first value of current flow is zero.

41. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage; and blocking current through the first and second current paths by use of the first and second substantially definite voltage drop thresholds during an interval following and contiguous with at least one of the first and second intervals;

wherein:

the second interval current flowing step is subsequent to the first interval current flowing step;

the second voltage is indicative of a first logical state; and the current blocking step comprises blocking current during an interval following and contiguous with the second interval;

further comprising:

flowing current during a third interval through the first current path to increase voltage across the stored charge element to a third voltage greater than the second voltage;

flowing current during a fourth interval subsequent to the third interval through the second current path to decrease voltage across the stored charge element to a fourth voltage greater than the second voltage, the fourth voltage being indicative of a second logical state different than the first logical state; and blocking current through the first and second current paths by use of the first and second substantially definite voltage drop thresholds during an interval following and contiguous with the fourth interval.

42. A method as in claim 41 wherein the second voltage is indicative of a logical zero and the fourth voltage is indicative of a logical one.

43. A method as in claim 41 wherein the first and third voltages are equal, further comprising:

attempting to flow current during a fifth interval through the first current path to increase voltage across the stored charge element to the first voltage; and sensing current flow during the fifth interval, a sensed first value of current flow indicating a particular one of the plurality of logical states and a sensed second value of current flow indicating another particular one of the plurality of logical states.

44. A method as in claim 43 wherein the sensed first value of current flow is zero.

45. A method as in claim 32 wherein:

the first interval current flowing step comprises establishing a first voltage differential across a series combination of the first current path and the stored charge element, the first voltage differential being greater than the first substantially definite voltage drop threshold by an amount in effect equal to a first predetermined charge voltage across the stored charge element; and the second interval current flowing step comprises establishing a second voltage differential across a series combination of the second current path and the stored charge element, the second voltage differential being greater than the second substantially definite voltage drop threshold by an amount in effect equal to a second predetermined charge voltage across the stored charge element, the second predetermined charge voltage being less than the first predetermined charge voltage.

46. A method as in claim 45 wherein the first substantially definite voltage drop threshold is about plus seven tenths of a volt, the first voltage is about 2.85 volts, the first voltage differential is about 3.55 volts, the second substantially definite voltage drop threshold is about five volts, the second voltage is about zero volts, and the second voltage differential is about five volts.

47. A method as in claim 32 wherein:

a voltage $V_H$ across the stored charge element is indicative of a first logical state and a voltage $V_L$ across the stored charge element is indicative of a second logical state;

the substantially definite voltage drop threshold of the first current path is represented by $V_I$ and the substantially definite voltage drop threshold of the second current path is represented by $V_O$;

the first interval current flowing step comprises establishing voltages $V_{1C}$ and $V_{2C}$ across the first current path and the stored charge element, the voltages $V_{1C}$ and $V_{2C}$ being related approximately in accordance with the expression $V_{2C}+V_H \geq V_I+V_{1C}$; and the second interval current flowing step comprises establishing voltages $V_{1D}$ and $V_{3D}$ across the second current path and the stored charge element, the voltages $V_{1D}$ and $V_{3D}$ being related approximately in accordance with the expression $V_{1D} \geq V_L+V_O+V_{3D}$.

48. A method as in claim 47 wherein the current blocking step comprises:

establishing an idle voltage $V_{1X}$ and the voltage $V_{2C}$ across the first current path and the stored charge element, the voltages $V_{1X}$ and $V_{2C}$ being related approximately in accordance with the expression $V_{2C}+V_L \leq V_I+V_{1X}$;

establishing an idle voltage $V_{1X}$ and the voltage $V_{3D}$ across the second current path and the stored charge element, the voltages $V_{1X}$ and $V_{3D}$ being related approximately in accordance with the expression $V_{1X} \leq V_H+V_O+V_{3D}$;

establishing an idle voltage $V_{2X}$ and the voltage $V_{1C}$ across the first current path and the stored charge element, the voltages $V_{1C}$ and $V_{2X}$ being related approximately in accordance with the expression $V_{2X}+V_L \leq V_I+V_{1C}$ establishing an idle voltage $V_{2X}$ and the voltage $V_{1D}$ across the first current path and the stored charge element, the voltages $V_{1D}$ and $V_{2X}$ being related approximately in accordance with the expression $V_{2X}+V_L \leq V_I+V_{1D}$;

establishing an idle voltage $V_{3X}$ and the voltage $V_{1C}$ across the second current path and the stored charge element, the voltages $V_{1C}$ and $V_{3X}$ being related approximately in accordance with the expression $V_{1C} \leq V_H+V_O+V_{3X}$; and establishing an idle voltage $V_{3X}$ and the voltage $V_{1D}$ across the second current path and the stored charge element, the voltages $V_{1D}$ and $V_{3X}$ being related approximately in accordance with the expression $V_{1D} \leq V_H+V_O+V_{3X}$.

49. A method as in claim 48 wherein $V_H$ exceeds $V_L$ by not more than about half of $V_f+V_O$.

50. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage;

blocking current through the first and second current paths by use of the first and second substantially definite voltage drop thresholds during an interval following and contiguous with at least one of the first and second intervals; and applying the voltage across the stored charge element to a control terminal of an amplifying valve, wherein the amplifying valve has a first conductance characteristic when the voltage across the stored charge element indicates a particular one of the plurality of logical states and has a second conductance characteristic different from the first conductance characteristic when the voltage across the stored charge element indicates another particular one of the plurality of logical states.

51. A method as in claim 50 wherein the amplifying valve is a MOSFET having a gate capacitance, and the stored charge element is the gate capacitance of the MOSFET.

52. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage;

blocking current through the first and second current paths by use of the first and second substantially definite voltage drop thresholds during an interval following and contiguous with at least one of the first and second intervals;

applying the voltage across the stored charge element to an input/output terminal of a latch to establish a logical state thereof; and detecting the logical state of the latch through one of the first and second current paths.

53. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage; and blocking current through the first and second current paths by use of the first and second substantially definite voltage drop thresholds during an interval following and contiguous with at least one of the first and second intervals;

wherein the stored charge element is capacitance of an input/output terminal of a latch, further comprising:

establishing a logical state of the latch through at least one of the first and second current paths; and detecting the logical state of the latch through at least one of the first and second current paths.

54. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage;

blocking current through the first and second current paths by use of the first and second substantially definite voltage drop thresholds during an interval following and contiguous with at least one of the first and second intervals; and applying the voltage across the stored charge element to a control terminal of an amplifying valve, wherein:

the first interval current flowing step comprises establishing a first voltage differential across a series combination of the first current path and the stored charge element, the first voltage differential being greater than the first substantially definite voltage drop threshold by an amount sufficient to establish a precharge voltage across the stored charge element, wherein the amplifying valve has a first conductance characteristic; and the second interval current flowing step comprises establishing a second voltage differential across a series combination of the second current path and the stored charge element, the second voltage differential being greater than the second substantially definite voltage drop threshold by an amount sufficient to established a first predetermined voltage across the stored charge element different than the precharge voltage, wherein the amplifying valve has a second conductance characteristic to indicate a first logical state; and determining a conductance characteristic of the amplifying valve to indicate an output logical state, the output logical state being the first logical state when the conductance characteristic of the amplifying valve is the second conductance characteristic.

55. A method as in claim 54 wherein the first conductance characteristic is indicative of a first logical state, the output logical state being the second logical state when the conductance characteristic of the amplifying valve is the first conductance characteristic.

56. A method as in claim 54 wherein the amplifying valve is a MOSFET having a gate capacitance, and the stored charge element is the gate capacitance of the MOSFET.

57. A method of controlling voltage across a stored charge element so as to indicate a particular one of a plurality of different logical states, comprising:

flowing current during a first interval through a first current path having a first substantially definite voltage drop threshold above which conduction occurs with no significant deterioration over time and below which significant conduction does not occur, to increase voltage across the stored charge element to a first voltage;

flowing current during a second interval through a second current path having a second substantially definite voltage drop threshold above which conduction occurs with no significant deterioration over time and below which significant conduction does not occur, to decrease voltage across the stored charge element to a second voltage, the second voltage being less than the first voltage;

blocking current through the first and second current paths by use of the first and second substantially definite voltage drop thresholds during an interval following and contiguous with at least one of the first and second intervals;

linking N two-terminal memory cells in a closed loop chain of N memory cells, the memory cells storing one of a high value of voltage $V_H$ to indicate a first logical state and a low value of voltage $V_L$ to indicate a second logical state different than the first logical state;

performing the first interval flowing step wherein the substantially definite voltage drop thresholds of the charge input paths of the N memory cells are substantially equal to a value $V_I$; and performing the second interval flowing step wherein the substantially definite voltage drop thresholds of the charge output paths of the N memory cells are substantially equal to a value $V_O$;

wherein $V_I$ and $V_O$ are related to $V_H$ and $V_L$ by the expression $V_H - V_L \leq (V_I + V_O)(N-2)/N$.

58. A memory as in claim 22 wherein the respective voltage drop thresholds of the charge input path and the charge output path are unequal.

59. A memory as in claim 58 wherein the charge input path and the charge output path are opposite directions through a bi-directional voltage dropping element having a first terminal coupled to the second terminal of the stored charge device and a second terminal that includes the second and third memory access nodes.

60. A memory as in claim 59 wherein the bi-directional voltage dropping element is a Zener diode.

61. A memory as in claim 22 wherein:

the control terminal of the amplifying valve has an intrinsic capacitance; and the stored charge element is the intrinsic capacitance of the amplifying valve.

62. A memory as in claim 60 wherein the amplifying valve is a MOSFET and the charge storage element is gate capacitance of the MOSFET.

63. A memory as in claim 61 wherein:

the amplifying valve is a MOSFET; and the intrinsic capacitance of the amplifying valve is gate capacitance of the MOSFET.

64. A memory as in claim 63 further comprising a diode connected between the second current terminal of the amplifying valve and the memory read node, the diode having an anode coupled to the memory read node and a cathode coupled to the second current terminal of the amplifying valve.

65. A memory as in claim 23 wherein conduction through the first and second charge input paths and through the first and second charge output paths occurs with no significant deterioration over time.

66. A memory as in claim 65 wherein:

the first and second stored charge elements are respective integrated circuit capacitors;

the first charge input path and the first charge output path are opposite directions through respective integrated circuit diodes; and the second charge input path and the second charge output path are opposite directions through respective integrated circuit diodes.

67. A memory as in claim 25 wherein the respective voltage drop thresholds of the charge input path and the charge output path are unequal.

68. A memory as in claim 67 wherein conduction through the charge input path and the charge output path occurs with no significant deterioration over time.

69. A memory as in claim 68 wherein:

the stored charge element is an integrated circuit capacitor; and the charge input path and the charge output path are opposite directions through a Zener diode.

70. A memory as in claim 28 wherein the respective voltage drop thresholds of the first charge input path and the first charge output path are unequal, and the respective voltage drop thresholds of the second charge input path and the second charge output path are unequal.

71. A memory as in claim 70 wherein conduction through the first and second charge input paths and through the first and second charge output path occurs with no significant deterioration over time.

72. A memory as in claim 71 wherein:

the first and second stored charge elements are respective integrated circuit capacitors;

the first charge input path and the first charge output path are opposite directions through a Zener diode; and the second charge input path and the second charge output path are opposite directions through a Zener diode.

73. An apparatus as in claim 29 wherein conduction through the charge input path and the charge output path occurs with no significant deterioration over time.

74. A memory as in claim 73 wherein the charge input path and the charge output path are opposite directions through a bi-directional voltage dropping element.

75. A memory as in claim 74 wherein the respective voltage drop thresholds of the charge input path and the charge output path through the bi-directional voltage dropping element are unequal.

76. A memory as in claim 75 wherein the bi-directional voltage dropping element has a first terminal coupled to the second terminal of the stored charge device and a second terminal that includes the second and third memory access nodes.

77. A memory as in claim 76 wherein the bi-directional voltage dropping element is a Zener diode.

78. An apparatus as in claim 31 wherein conduction through the charge input path and the charge output path occurs with no significant deterioration over time.

79. A memory as in claim 31 wherein:
the first-mentioned charge input path and the first-mentioned charge output path are opposite directions through respective Zener diodes; and
the additional charge input paths and the additional charge output paths are opposite directions through respective Zener diodes.

80. A method as in claim 39 wherein the first substantially definite voltage drop threshold and the second substantially definite voltage drop threshold are unequal.

81. A method as in claim 41 wherein the first substantially definite voltage drop threshold and the second substantially definite voltage drop threshold are unequal.

82. A method as in claim 50 wherein the first substantially definite voltage drop threshold and the second substantially definite voltage drop threshold are unequal.

83. A method as in claim 52 wherein the first substantially definite voltage drop threshold and the second substantially definite voltage drop threshold are unequal.

84. A method as in claim 53 wherein the first substantially definite voltage drop threshold and the second substantially definite voltage drop threshold are unequal.

85. A method as in claim 54 wherein the first substantially definite voltage drop threshold and the second substantially definite voltage drop threshold are unequal.

86. A method as in claim 57 wherein the first substantially definite voltage drop threshold and the second substantially definite voltage drop threshold are unequal.

* * * * *